(12) United States Patent
Miyamoto et al.

(10) Patent No.: US 9,166,580 B2
(45) Date of Patent: Oct. 20, 2015

(54) GATE SIGNAL LINE DRIVE CIRCUIT AND DISPLAY

(71) Applicant: Japan Display Inc., Tokyo (JP)

(72) Inventors: Motoharu Miyamoto, Tokyo (JP); Takahiro Ochiai, Tokyo (JP); Hideo Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 7 days.

(21) Appl. No.: 14/250,487

(22) Filed: Apr. 11, 2014

(65) Prior Publication Data

US 2014/0306947 A1 Oct. 16, 2014

(30) Foreign Application Priority Data

Apr. 12, 2013 (JP) ................................ 2013-083700

(51) Int. Cl.
*H03K 17/16* (2006.01)
(52) U.S. Cl.
CPC .............. *H03K 17/162* (2013.01); *H03K 17/16* (2013.01)
(58) Field of Classification Search
CPC .................. G09G 2330/12; G09G 2310/0245; G09G 2310/063; H03K 17/162; H03K 17/16
See application file for complete search history.

(56) References Cited

U.S. PATENT DOCUMENTS 7,633,477 B2 * 12/2009 Jang et al. ........................ 345/92
2010/0265243 A1 * 10/2010 Kotani et al. ................. 345/212

FOREIGN PATENT DOCUMENTS

JP 2010-256422 11/2010

* cited by examiner

*Primary Examiner* — Lun-Yi Lao
*Assistant Examiner* — Jarurat Suteerawongsa
(74) *Attorney, Agent, or Firm* — Lowe Hauptman & Ham, LLP

(57) ABSTRACT

A gate signal line drive circuit and a display using the circuit, which suppress a leak current to reduce a power consumption. A gate signal line drive circuit that supplies a high voltage in a signal high period, and supplies a low voltage in a signal low period, the gate signal line drive circuit including: a high voltage supply switching element that turns on in response to the high period, supplies a voltage of a first basic clock signal to gate signal lines; a high voltage supply off control circuit that supplies a first low voltage to a switch of the high voltage supply switching element in response to the signal low period; and a low voltage supply switching circuit that supplies a second low voltage higher than the first low voltage to the gate signal lines in response to the signal low period.

11 Claims, 17 Drawing Sheets

PRIOR ART

GATE SIGNAL LINE DRIVE CIRCUIT AND DISPLAY

CROSS-REFERENCE TO RELATED APPLICATION

The present application claims priority from Japanese application JP 2013-083700, filed on Apr. 12, 2013, the content of which is hereby incorporated by reference into this application.

BACKGROUND OF THE INVENTION

1. Field of the Invention

The invention relates a gate signal line drive circuit and a display using the same. In particular, the invention relates to suppression of a leak current in a gate signal line drive circuit.

2. Description of the Related Art

Up to now, for example, in a liquid crystal display device, a circuit thin film transistors (hereinafter referred to as "TFT") arranged in pixel areas of a display screen are formed on the same substrate, that is, a circuit with a built-in shift register may be employed.

The shift register circuit provided in the gate signal line drive circuit outputs agate signal $G_{out}$, which becomes a high voltage in a signal high period, and becomes a low voltage in a signal low period which is a period other than the signal high period, to a corresponding gate signal line.

FIG. 17 is a schematic diagram illustrating a configuration of a shift register circuit in a related art. The shift register circuit includes a high voltage supply switching element SWG that supplies a high voltage to the gate signal line in response to the signal high period, a low voltage supply switching element SWA that supplies a low voltage to the gate signal line in response to the signal low period, and a high voltage supply off control element SWB that supplies a low voltage to a switch (control terminal) of the high voltage supply switching element SWG in response to the signal low period.

A low voltage line $V_{GL}$ is connected to an input terminal of the low voltage supply switching element SWA. In response to the signal low period, the low voltage supply switching element SWA turns on and the low voltage supply switching element SWA outputs the low voltage which is a voltage of the low voltage line $V_{GL}$. The low voltage supply switching element SWA turns off in response to the signal high period. The high voltage is supplied to a switch (control terminal) of the low voltage supply switching element SWA while the low voltage supply switching element SWA is on.

A basic clock signal CLK which becomes high voltage in the signal high period is connected to an input terminal of the high voltage supply switching element SWG. The high voltage supply switching element SWG turns on in response to the signal high period, and the high voltage supply switching element SWG outputs a voltage of the basic clock signal CLK, and the high voltage supply switching element SWG turns off in response to the signal low period. The high voltage is supplied to the switch of the high voltage supply switching element SWG while the high voltage supply switching element SWG is on, and the low voltage is supplied to the switch of the high voltage supply switching element SWG while the high voltage supply switching element SWG is off.

A high voltage supply off control element SWB that supplies the low voltage in response to the signal low period is connected to the switch of the high voltage supply switching element SWG. The low voltage line $V_{GL}$ is connected to an input terminal of the high voltage supply off control element SWB. The high voltage supply off control element SWB turns on in response to the signal low period, and the high voltage supply off control element SWB supplies the low voltage to the switch of the high voltage supply switching element SWG. The high voltage supply off control element SWB turns off in response to the signal high period. The high voltage is supplied to the switch (control terminal) of the high voltage supply off control element SWB while the high voltage supply off control element SWB is on.

Most of one frame period for displaying one screen is the signal low period. Hence, the high voltage is supplied to the respective switches of the low voltage supply switching element SWA and the high voltage supply off control element SWB in response to the signal low period for a long period. The low voltage supply switching element SWA and the high voltage supply off control element SWB become on for a long period, and those elements are deteriorated earlier than the other elements. A gate signal line drive circuit in which a plurality of elements are arranged in parallel in order to suppress the deterioration of those elements, and at least any one of the plurality of elements is driven under the control, to thereby suppress the deterioration of the elements is disclosed in JP 2010-256422 A.

SUMMARY OF THE INVENTION

The present inventors have studied a basic circuit 113 of a shift register circuit 112 illustrated in FIG. 4 of JP 2010-256422 A. As a result, the inventors have obtained knowledge that a leak current generated in the signal low period is generated at a considerable level in a transistor T5 corresponding to the high voltage supply switching element SWG, thereby leading to an increase in the power consumption. A basic clock signal CLK1 input to an input terminal of the transistor T5 becomes periodically high voltage, and when the basic clock signal CLK1 becomes high voltage, the leak current flows from the input terminal (drain) of the transistor T5 to an output terminal (source) and an output terminal OUT.

The invention has been made in view of the above problems, and aims at providing a gate signal line drive circuit that suppresses the leak current, and reduces a power consumption, and a display using the same.

(1) According to the invention, there is provided a gate signal line drive circuit that supplies a high voltage to gate signal lines in a signal high period periodically repeated, and supplies a low voltage to the gate signal lines in a signal low period which is a period other than the signal high period, the gate signal line drive circuit including: a high voltage supply switching element that receives a first basic clock signal which becomes the high voltage in the signal high period at an input terminal thereof, turns on in response to the signal high period, supplies a voltage of the first basic clock signal to the gate signal lines, and turns off in response to the signal low period; a high voltage supply off control circuit that supplies a first low voltage to a switch of the high voltage supply switching element in response to the signal low period to turn off the high voltage supply switching element; and a low voltage supply switching circuit that supplies a second low voltage higher than the first low voltage to the gate signal lines as the low voltage in response to the signal low period, and turns off in response to the signal high period, in which the high voltage supply off control circuit includes: a first high voltage supply off control element having an input terminal connected with a first voltage line, and an output terminal connected to the switch of the high voltage supply switching element; and a second high voltage supply off control element having an input terminal connected with a second voltage line, and an output terminal connected to the switch of the high voltage supply switching element. In the gate signal line drive circuit, the low voltage supply switching circuit includes: a first low voltage supply switching element having an input terminal connected with a third voltage line, and an output terminal connected with the gate signal lines; and a second low voltage supply switching element having an input terminal connected with a fourth voltage line, and an output terminal connected with the gate signal lines. In a first period including two or more signal high periods sequentially coming, and starting from the signal low period, the first low voltage is supplied to the first voltage line, and the second low voltage is supplied to the third voltage line, the first high voltage supply off control element and the first low voltage supply switching element are in a drive on-state to turn on/off, and the second high voltage supply off control element and the second low voltage supply switching element are in a drive off-state to be kept in an off-state.

(2) The gate signal line drive circuit according to the above item (1), further including a first control switching element that turns on in the first period, supplies the first low voltage to a switch of the second low voltage supply switching element, and puts the second low voltage supply switching element into the drive off-state.

(3) In the gate signal line drive circuit according to any one of the above item (1) or (2), in a second period including two or more signal high periods sequentially coming, and starting from the signal low period, and subsequent to the first period, the first low voltage is supplied to the second voltage line, and the second low voltage is supplied to the fourth voltage line, the second high voltage supply off control element and the second low voltage supply switching element are in the drive on-state, and the first high voltage supply off control element and the first low voltage supply switching element are in the drive off-state.

(4) The gate signal line drive circuit according to the above item (3), further including a second control switching element that turns on in the second period, supplies the first low voltage to a switch of the first low voltage supply switching element, and puts the first low voltage supply switching element into the drive off-state.

(5) In the gate signal line drive circuit according to any one of the above items (1) to (4), the high voltage is supplied to the second voltage line and the fourth voltage line in the first period.

(6) In the gate signal line drive circuit according to any one of the above items (1) to (4), an intermediate voltage between the first low voltage and the high voltage is supplied to the second voltage line in the first period.

(7) In the gate signal line drive circuit according to the above item (6), the intermediate voltage is a ground voltage.

(8) In the gate signal line drive circuit according to any one of the above items (1) to (4), the second voltage line is connected to the third voltage line, and the fourth voltage line is connected to the first voltage line.

(9) In the gate signal line drive circuit according to any one of the above items (1) to (8), the first basic clock signal is a clock signal that repeats m clocks (integer of m≥3) as a cycle, and a second clock which is one previous clock of a first clock being the high voltage is the second low voltage, and the high voltage supply switching element is on in a period which is a clock before the high voltage period.

(10) In the gate signal line drive circuit according to any one of the above items (1) to (8), the first basic clock signal is a clock signal that repeats m clocks (integer of m≥3) as a cycle, and a third clock which is one next clock to a first clock being the high voltage is the second low voltage, and the high voltage supply switching element is on in a period which is a clock after the high voltage period.

(11) A display including the gate signal line drive circuit according to any one of the above items (1) to (10).

According to the invention, there is provided a gate signal line drive circuit and a display using the circuit, which suppress a leak current to reduce a power consumption.

DETAILED DESCRIPTION OF THE INVENTION

Hereinafter, embodiments of the invention will be described specifically and in detail with reference to the accompanying drawings.

In all of the drawings for illustrating the embodiments, members having the same function are denoted by identical symbols, and its repetitive description will be omitted. Also, the drawings described below illustrate the embodiments consistently, and sizes of the drawings do not always match reduction scale described in the embodiments.

First Embodiment

Figure 1:
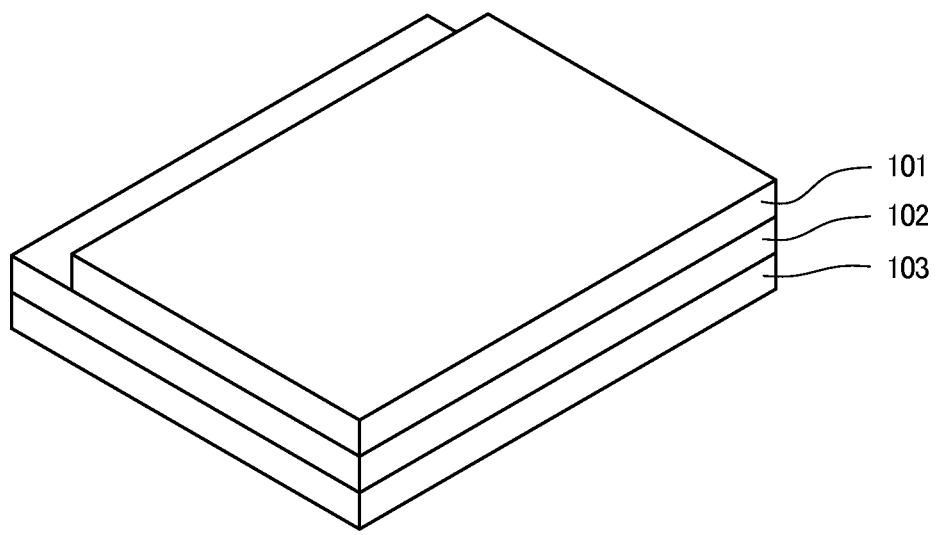
FIG. 1 is an overall perspective view of a liquid crystal display device according to a first embodiment of the invention.

A display according to a first embodiment of the invention is, for example, an IPS (in-plane switching) liquid crystal display device. FIG. 1 is an overall perspective view of a liquid crystal display device according to this embodiment. As illustrated in FIG. 1, the liquid crystal display device according to this embodiment includes: a TFT substrate 102 having gate signal lines 105, image signal lines 107, pixel electrodes 110, common electrodes 111, and TFTs 109, which will be described later, arranged thereon; a filter substrate 101 that faces the TFT substrate 102, and has color filters disposed thereon; a liquid crystal material sealed in an area sandwiched between both of those substrates; and a backlight 103 that positioned in contact with an opposite side of the TFT substrate 102 to the filter substrate 101 side.

Figure 2:
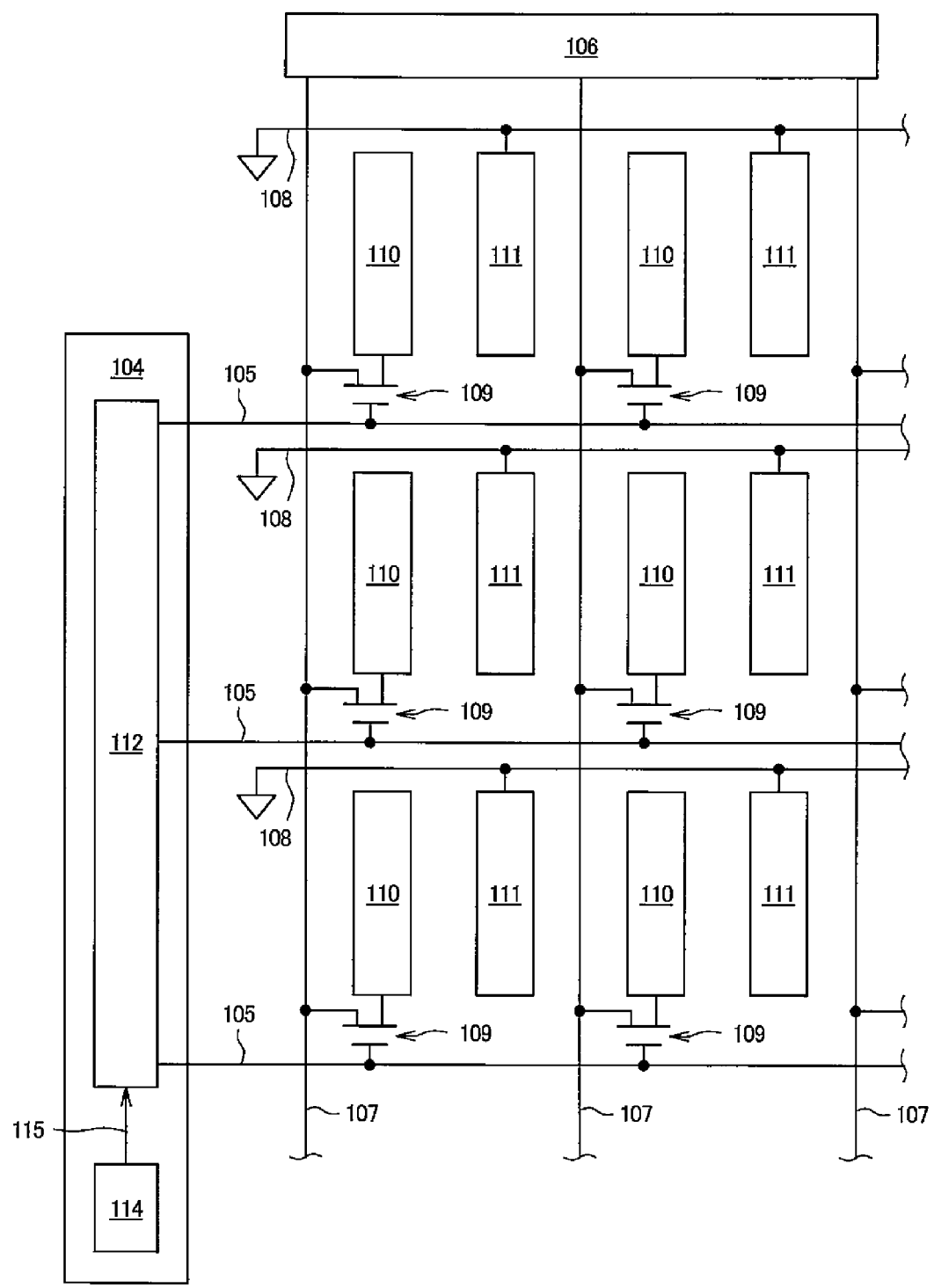
FIG. 2 is a conceptual view of an equivalent circuit of a TFT substrate according to the first embodiment of the invention.

FIG. 2 is a conceptual view of an equivalent circuit of the TFT substrate 102 according to this embodiment. Referring to FIG. 2, a large number of gate signal lines 105 connected to agate signal line drive circuit 104 are extended at regular intervals therebetween in a lateral direction of the drawing on the TFT substrate 102.

The gate signal line drive circuit 104 includes a shift register control circuit 114 and a shift register circuit 112. The shift register control circuit 114 outputs control signals 115, which will be described later, to the shift register circuit 112.

The shift register circuit 112 includes a plurality of basic circuits 113 corresponding to the respective plural gate signal lines 105. For example, if 800 gate signal lines 105 are present, 800 basic circuits 113 are likewise disposed in the shift register circuit 112. According to the control signals 115 input from the shift register control circuit 114, each of the basic circuits 113 outputs a gate signal which becomes high voltage in a corresponding gate scanning period (signal high period), and low voltage in a period (signal low period) other than the gate scanning period in one frame period to a corresponding gate signal line 105. That is, each of the basic circuits 113 supplies the high voltage to the corresponding gate signal line 105 in a periodically repetitive signal high period, and supplies the low voltage to the corresponding gate signal line 105 in the signal low period. In FIG. 2, for simplification of illustration, the gate signal line drive circuit 104 is illustrated on only left side of the drawing. However, actually, an odd gate signal line drive circuit that outputs the gate signal to odd gate signal lines 105 (400 lines) is disposed on a right side of the drawing, and an even gate signal line drive circuit that outputs the gate signal to even gate signal lines 105 (400 lines) is disposed on a left side of the drawing.

Also, a large number of image signal lines 107 connected to a data drive circuit 106 extend at regular intervals therebetween in a longitudinal direction of the drawing. Pixel areas arranged in a grid pattern are sectioned by the gate signal lines 105 and the image signal lines 107. Also, common signal lines 108 are extended in parallel to the respective gate signal lines 105 in the lateral direction of the drawing.

Each TFT 109 is formed at a corner of each pixel area sectioned by the gate signal lines 105 and the image signal lines 107. The TFT 109 is connected to the corresponding image signal line 107 and the corresponding pixel electrode 110. Also, a gate of the TFT 109 is connected with the gate signal line 105. In each pixel area, the common electrode 111 is formed to face the pixel electrode 110.

In the above circuit configuration, a reference voltage is supplied to the common electrode 111 of each pixel circuit through the common signal line 108. Also, the gate voltage is selectively supplied to the gate of the TFT 109 through the gate signal line 105, to thereby control a current flowing in the TFT 109. A voltage of an image signal supplied to the image signal line 107 is selectively supplied to the pixel electrode 110 through the TFT 109 whose gate is selectively supplied with the gate voltage. A potential difference is generated between the pixel electrodes 110 and the common electrodes 111 to control orientations of liquid crystal molecules, as a result of which the degree of shielding a light from the backlight 103 is controlled to display an image.

Figure 3:
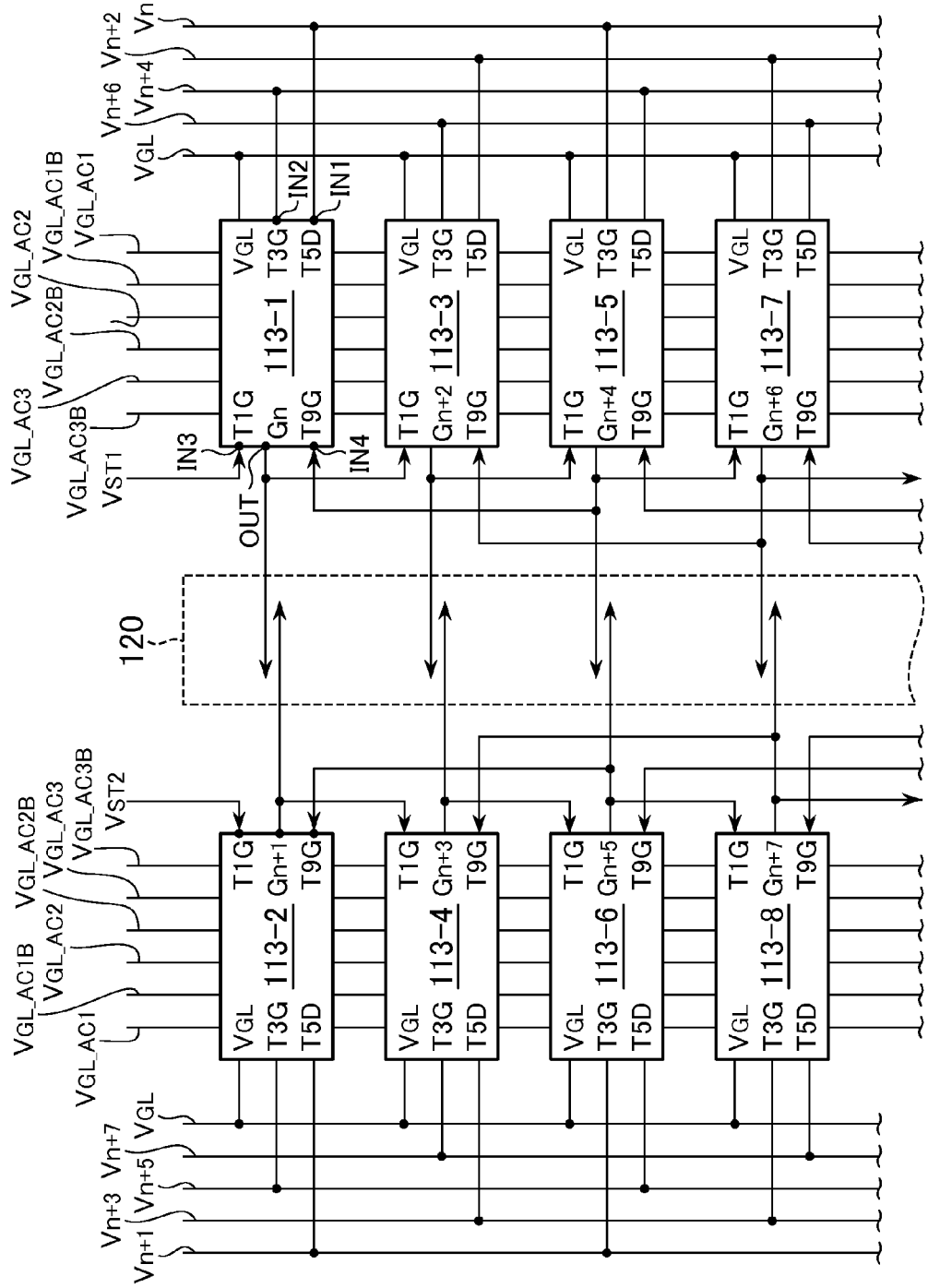
FIG. 3 is a block diagram of a shift register circuit according to the first embodiment of the invention.

FIG. 3 is a block diagram of the shift register circuit 112 according to this embodiment. For example, if 800 gate signal lines 105 are present, 800 basic circuits 113 corresponding to the respective 800 gate signal lines 105 are disposed in the shift register circuit 112. As described above, 400 odd basic circuits corresponding to the respective odd gate signal lines 105 (400 lines) are located on a right side of a display area 120, and 400 even basic circuits corresponding to the respective even gate signal lines 105 (400 lines) are located on a left side of the display area 120. FIG. 3 illustrates eight basic circuits 113 from n=1 to n=8 among the 800 basic circuits 113. In FIG. 3, an n-th basic circuit is shown as a basic circuit 113-$n$.

The control signals 115 output to the shift register circuit 112 by the shift register control circuit 114 include basic clock signals $V_1$ to $V_8$, the voltage of a low voltage line $V_{GL}$ that supplies the first low voltage $V_{GL}$, voltages of three pairs of AC voltage lines, and auxiliary signals $V_{ST1}$, $V_{ST2}$. In this example, the three pairs of AC voltage lines include a pair of AC voltage lines $V_{GL\_AC1}$, $V_{GL\_AC1B}$, a pair of AC voltage lines $V_{GL\_AC2}$, $V_{GL\_AC2B}$, and a pair of AC voltage lines $V_{GL\_AC3}$, $V_{GL\_AC3B}$.

In general, an m-phase basic clock signal will be described. The m-phase basic clock signal is a clock signal different in phase from each other at a given cycle T. When it is assumed that a cycle of the basic clock signal is T, one cycle T of the m-phase basic clock signal can be subdivided into m periods of T/m. When the period of T/m is called "one clock", one cycle T includes m clocks. The respective clock signals of the m-phase basic clock signal become high voltage in one clock, and low voltage in the other clocks in each cycle T.

In this embodiment, four-phase basic clock signals $V_1$, $V_3$, $V_5$, and $V_7$ become sequentially a high voltage $V_{GH}$ for each clock, and is the first low voltage $V_{GL}$ in the other clocks in a period of one cycle T. For example, the high voltage $V_{GH}$ is +15V, and the first low voltage $V_{GL}$ is −14V. Four-phase basic clock signals $V_2$, $V_4$, $V_6$, and $V_8$ are clock signals that become the high voltage $V_{GH}$ later than the four-phase basic clock signals $V_1$, $V_3$, $V_5$, and $V_7$ by half clock, respectively. When it is assumed that a period during the image signal is written per pixel is one horizontal scanning period (1H period), one clock of the basic clock signal is a length of two horizontal scanning periods (2H period).

As exemplified by a basic circuit 113-1 in FIG. 3, each of the basic circuits 113 illustrated in FIG. 3 includes four input terminals IN1, IN2, IN3, IN4, one output terminal OUT. Each of the basic circuits 113 is also connected with the low voltage line $V_{GL}$, and three pairs of AC voltage lines.

A gate signal $G_n$ is output from the output terminal OUT of the n-th basic circuit 113-$n$ to the display area 120. A basic clock signal $V_n$ is input to the input terminal IN1 of the n-th basic circuit 113-$n$, and a basic clock signal $V_{n+4}$ is input to the input terminal IN2. FIG. 3 illustrates the first basic circuits 113-1 as an example of the n-th basic circuit 113-$n$. That is, the basic clock signal input to the input terminal IN1 of the first basic circuit 113-1 is expressed as the basic clock signal $V_n$ (=$V_1$), and the basic signal input to the input terminal IN2 is expressed as the basic clock signal $V_{n+4}$ (=$V_5$). Also, the input terminal IN3 of the n-th basic circuit 113-$n$ receives a gate signal $G_{n-2}$ from an (n−2)-th basic circuit 113-($n$−2), and the input terminal IN4 receives a gate signal $G_{n+4}$ from an (n+4)-th basic circuit 113-($n$+4).

The n of the basic clock signal $V_n$ corresponds to n of the n-th basic circuit 113-$n$. However, since n of the actual basic clock signal $V_n$ takes only any value of 1 to 8, if the value of n of the basic circuits 113 exceeds 8, the value of n can be converted with the use of $V_{n-8}=V_n=V_{n+8}$, and the basic clock signal $V_n$ represents any basic clock signal of the $V_1$ to $V_8$. That is, n of the basic clock signal $V_n$ can be converted with [{(n−1) mod 8}+1].

Also, the input terminal IN3 of the first basic circuit 113-1, and the input terminal IN3 of the second basic circuit 113-2 have no corresponding gate signals, and therefore receive the auxiliary signals $V_{ST1}$ and $V_{ST2}$, respectively. Also, the input terminals IN4 of a 797th basic circuit 113-797 to an 800th basic circuit 113-800 have no corresponding gate signals, and are therefore provided with dummy circuits which become an 801st basic circuit to an 804th basic circuit, respectively. The input terminals IN4 of the 797th basic circuit 113-797 to the 800th basic circuit 113-800 receive output signals $G_{801}$ to $G_{804}$ which are outputs of an 801st basic circuit (dummy circuit) to an 804th basic circuit (dummy circuit), respectively.

Figure 4:
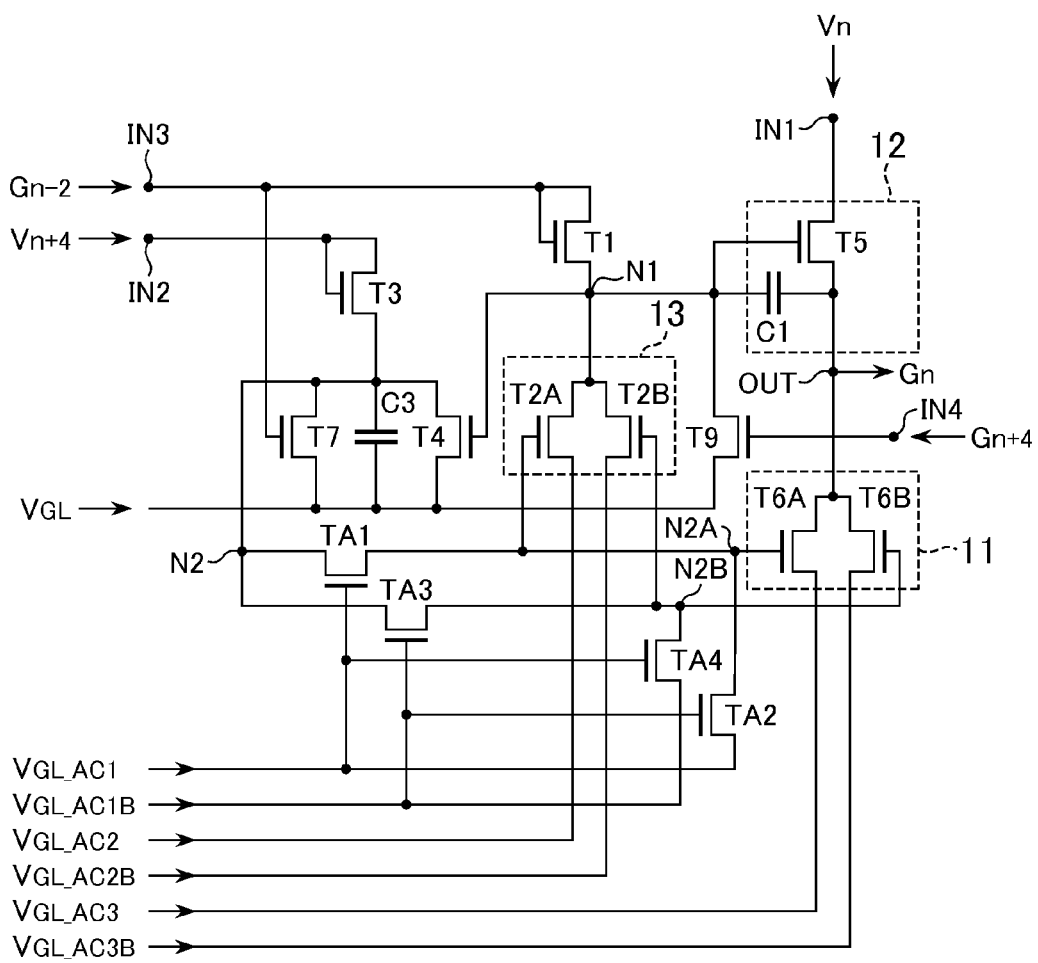
FIG. 4 is a circuit diagram of an n-th basic circuit according to the first embodiment of the invention.

FIG. 4 is a circuit diagram of the n-th basic circuit 113-$n$ according to this embodiment. All of transistors illustrated in FIG. 4 are configured by NMOS transistors (n-channel transistors). The n-th basic circuit 113-$n$ according to this embodiment includes a low voltage supply switching circuit 11, a high voltage supply switching circuit 12, and a high voltage supply off control circuit 13. The high voltage supply switching circuit 12 includes a transistor T5 which is a high voltage supply switching element, and a boost capacitor C1. An input terminal of the transistor T5 receives the basic clock signal $V_n$ (first basic clock signal). The basic clock signal $V_n$ is a clock signal which becomes the high voltage $V_{GH}$ in the signal high period. The transistor T5 becomes on in response to the signal high period, and the transistor T5 of an on-state outputs a voltage of the basic clock signal $V_n$ to the output terminal OUT. That is, the transistor T5 supplies the voltage of the basic clock signal $V_n$ to the corresponding gate signal line 105. The transistor T5 turns off in response to the signal low period. In this example, it is assumed that a voltage supplied to a gate (control terminal: switch) of the transistor T5 (high voltage supply switching element) is a node N1.

The high voltage supply off control circuit 13 turns on in response to the signal low period, supplies the first low voltage $V_{GL}$ to the node N1, and turns off the transistor T5. Also, the high voltage supply off control circuit 13 turns off in response to the signal high period. The high voltage supply off control circuit 13 includes a transistor T2A which is a first high voltage supply off control element, and a transistor T2B which is a second high voltage supply off control element. An input terminal of the transistor T2A is connected with the AC voltage line $V_{GL\_AC2}$ (first voltage line), and an input terminal of the transistor T2B is connected with the AC voltage line $V_{GL\_AC2B}$ (second voltage line). Both output terminals of the transistors T2A and T2B are connected to the node N1. That is, two transistors T2A and T2B are arranged to be connected in parallel with respect to the node N1.

The low voltage supply switching circuit 11 turns on in response to the signal low period, and outputs the second low voltage $V_{GL2}$ to the output terminal OUT. That is, the low voltage supply switching circuit 11 supplies the second low voltage $V_{GL2}$ to the corresponding gate signal lines 105 as the low voltage in response to the signal low period. Also, the low voltage supply switching circuit 11 turns off in response to the signal high period. In this example, the second low voltage $V_{GL2}$ is higher than the first low voltage $V_{GL}$, and lower than the high voltage $V_{GH}$. When the second low voltage $V_{GL2}$ is supplied to the gate of the transistor, the transistor turns off. When the high voltage $V_{GH}$ is +15V, and the first low voltage $V_{GL}$ is −14V, for example, the second low voltage $V_{GL2}$ is −12V. The low voltage supply switching circuit 11 includes a transistor T6A which is a first low voltage supply switching element, and a transistor T6B which is a second low voltage supply switching element. An input terminal of the transistor T6A is connected with the AC voltage line $V_{GL\_AC3}$ (third voltage line), and an input terminal of the transistor T6B is connected with the AC voltage line $V_{GL\_AC3B}$ (fourth voltage line). Both of an output terminal of the transistor T6A and an output terminal of the transistor T6B are connected to the output terminal OUT. That is, the transistor T6A and the transistor T6B are connected in parallel with respect to the output terminal OUT. In this example, it is assumed that a voltage which is supplied to gates (control terminals: switches) of the transistors T2A and T6A is at a node N2A, and a voltage which is supplied to gates (control terminals: switches) of the transistors T2B and T6B is at a node N2B.

The n-th basic circuit 113-$n$ according to this embodiment further includes transistors TA1, TA2, TA3, and TA4 forming four control switching elements. In this example, a node N2 is defined as illustrated in FIG. 4. Both terminals (input terminal and output terminal) of the transistor TA1 are connected to the respective nodes N2 and N2A, and a gate (control terminal: switch) of the transistor TA1 is connected to the AC voltage line $V_{GL\_AC1}$. Both terminals of the transistor TA3 are connected to the respective nodes N2 and N2B, and a gate of the transistor TA3 is connected to the AC voltage line $V_{GL\_AC1B}$. Also, an input terminal of the transistor TA2 (second control switching element) is connected to the AC voltage line $V_{GL\_AC1}$. An output terminal of the transistor TA2 is connected to the node N2A. A gate (control terminal: switch) of the transistor TA2 is connected to the AC voltage line $V_{GL\_AC1B}$. An input terminal of the transistor TA4 (first control switching element) is connected to the AC voltage line $V_{GL\_AC1B}$, and an output terminal of the transistor TA4 is connected to the node N2B. Also, a gate of the transistor TA4 is connected to the AC voltage line $V_{GL\_AC1}$.

Figure 5:
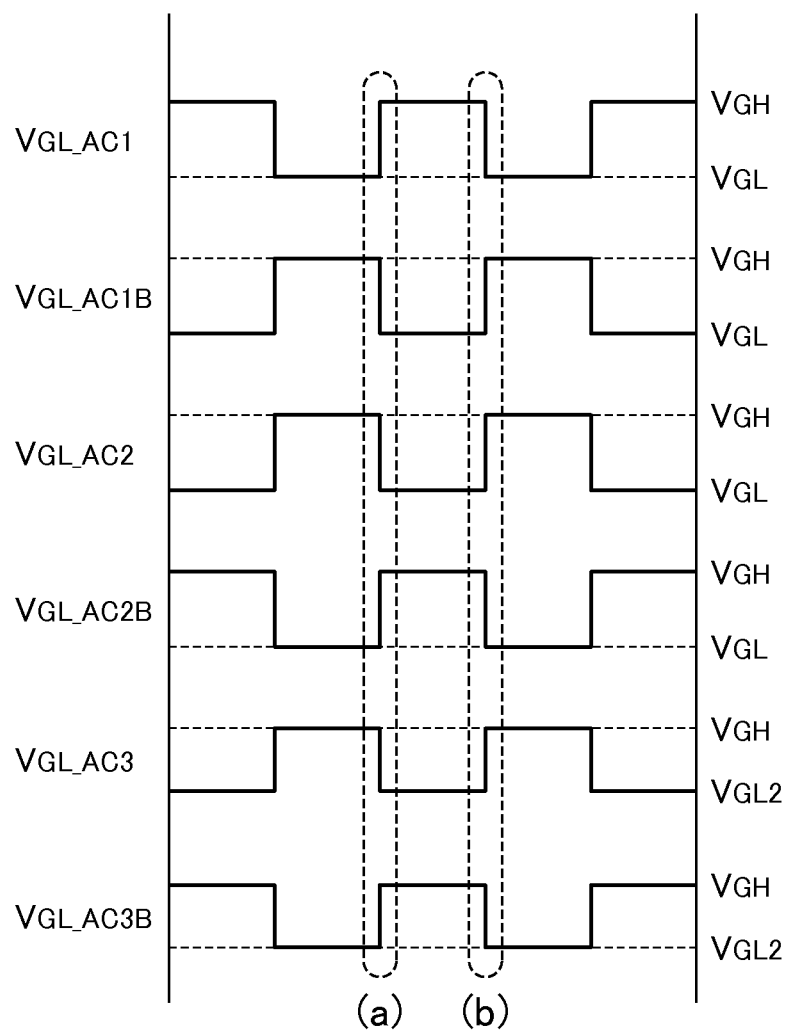
FIG. 5 is a diagram illustrating a time change of voltages of three pairs of AC voltage lines according to the first embodiment of the invention.

FIG. 5 is a diagram illustrating a time change of voltages of three pairs of AC voltage lines according to this embodiment. An axis of abscissa in FIG. 5 represents a time. Each pair of AC voltage lines are substantially opposite in phase to each other as will be described below. The pair of AC voltage lines $V_{GL\_AC1}$, $V_{GL\_AC1B}$, and the pair of AC voltage lines $V_{GL\_AC2}$, $V_{GL\_AC2B}$ each alternately repeat the high voltage $V_{GH}$ and the first low voltage $V_{GL}$, and the pair of AC voltage lines $V_{GL\_AC3}$ and $V_{GL\_AC3B}$ alternately repeat the high voltage $V_{GH}$ and the second low voltage $V_{GL2}$. For example, the voltages of three pairs of AC voltage lines switch from the high voltage to the low voltage (from the low voltage to the high voltage). This voltage switching is conducted during a flyback period (blanking period). In this example, the flyback period is a period during which any pixel does not contribute to a display in one frame period for displaying one screen. In all of the basic circuits 113, the gate signal is low voltage (second low voltage $V_{GL2}$).

In this example, a period including two or more (a first given number of) frame periods during which the AC voltage line $V_{GL\_AC1}$ is continuously high voltage $V_{GH}$ is defined as a first period. That is, the first period is a period including two or more (the first given number of) signal high periods sequentially coming, and starting from the signal low period. The first period is, for example, a period in which the AC voltage lines $V_{GL\_AC1}$ is changed from the first low voltage $V_{GL}$ to the high voltage $V_{GH}$ (for example, (a) shown in FIG. 5), and then changed from the high voltage $V_{GH}$ to the first low voltage $V_{GL}$ ((b) shown in FIG. 5). In the first period, the high voltage $V_{GH}$ which is a voltage of the AC voltage line $V_{GL\_AC1}$ is supplied to the respective gates of the transistors TA1 and TA4, and both of the transistors TA1 and TA4 are on. The transistor TA1 of the on-state renders the node N2 and the node N2A conductive. The transistor TA4 (first control switching element) of the on-state supplies the first low voltage $V_{GL}$ which is a voltage of the AC voltage line $V_{GL\_AC1B}$ to the node N2B. Also, the first low voltage $V_{GL}$ which is the voltage of the AC voltage line $V_{GL\_AC1B}$ is supplied to the respective gates of the transistors TA2 and TA3, and both of the transistors TA2 and TA3 turn off. The transistor TA3 becomes off so that the node N2B is isolated from the node N2, and the transistor TA2 becomes off so that the node N2A is isolated from the AC voltage line $V_{GL\_AC1}$. In the first period, the voltage of the node N2A is changed together with a change in the voltage of the node N2. The transistors T2A and T6A are on when the node N2 is the high voltage $V_{GH}$, and the transistors T2A and T6A are off when the node N2 is the first low voltage $V_{GL}$. That is, in the first period, the transistors T2A and T6A are in the drive on-state where those transistors T2A and T6A are turned on/off by a change in the voltage of the node N2. On the contrary, in the first period, since the node N2B is maintained at the first low voltage $V_{GL}$, the transistors T2B and T6B are in the drive off-state where the transistors T2B and T6B are maintained in the off-state. In the first period, the AC voltage line $V_{GL\_AC2}$ is the first low voltage $V_{GL}$, and when the transistor T2A turns on, the first low voltage $V_{GL}$ which is the voltage of the AC voltage line $V_{GL\_AC2}$ is output to the node N1. Also, in the first period, the AC voltage line $V_{GL\_AC3}$ is the second low voltage $V_{GL2}$, and when the transistor T6A turns on, the second low voltage $V_{GL2}$ which is the voltage of the AC voltage line $V_{GL\_AC3}$ is output to the output terminal OUT.

A period including two or more (a second given number of) frame periods during which the AC voltage line $V_{GL\_AC1}$ is continuously the first low voltage $V_{GL}$ is defined as a second period. That is, the second period is a period including two or more (the second given number of) signal high periods sequentially coming, and starting from the signal low period. The second period is subsequent to the first period, and the first period and the second period are alternately repeated. In the first period, the transistors TA1 and TA4 are maintained in the on-state, and the transistors TA2 and TA3 are maintained in the off-state. On the other hand, in the second period, the transistors TA2 and TA3 are maintained in the on-state, and the transistors TA1 and TA4 are maintained in the off-state. The transistor TA3 of the on-state electrically connects the node N2 and the node N2B. The transistor TA2 (second control switching element) of the on-state supplies the first low voltage $V_{GL}$ which is the voltage of the AC voltage line $V_{GL\_AC1}$ to the node N2A. In the second period, the transistors T2B and T6B are in the drive on-state where those transistors T2B and T6B are turned on/off by a change in the voltage of the node N2, and the transistors T2A and T6A are in the drive off-state where the transistors T2A and T6A are maintained in the off-state. In the second period, the AC voltage line $V_{GL\_AC2B}$ is the first low voltage $V_{GL}$, and when the transistor T2B turns on, the first low voltage $V_{GL}$ which is the voltage of the AC voltage line $V_{GL\_AC2B}$ is output to the node N1. Also, in the second period, the AC voltage line $V_{GL\_AC3B}$ is the second low voltage $V_{GL2}$, and when the transistor T6B turns on, the second low voltage $V_{GL2}$ which is the voltage of the AC voltage line $V_{GL\_AC3B}$ is output to the output terminal OUT.

Figure 6:
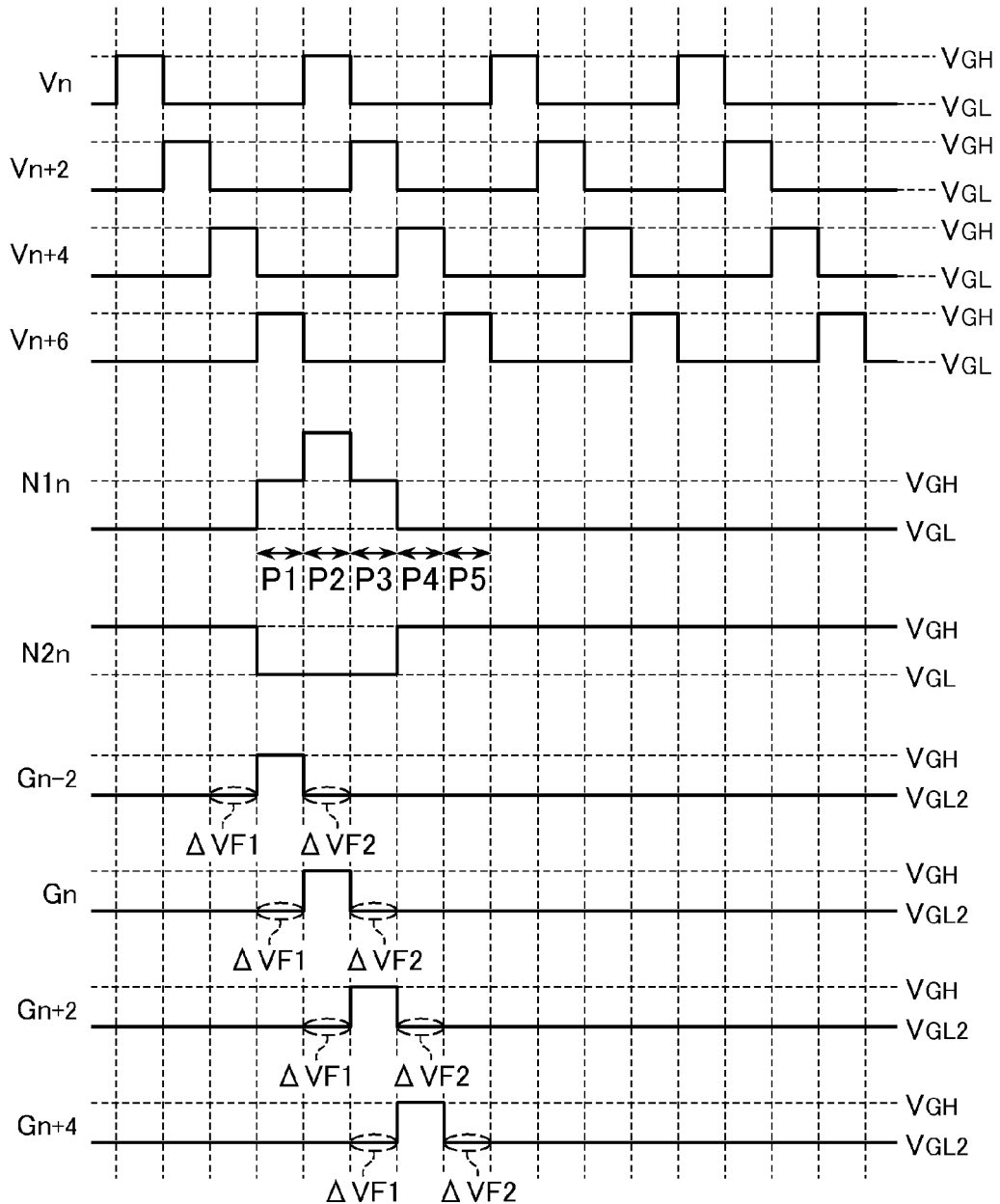
FIG. 6 is a diagram illustrating respective time changes of four-phase basic clock signals, nodes N1 and N2 of the n-th basic circuit, and gate signals of basic circuits close to the n-th basic circuit according to the first embodiment of the invention.

FIG. 6 is a diagram illustrating respective time changes of four-phase basic clock signals $V_n$, $V_{n+2}$, $V_{n+4}$, and $V_{n+6}$, the nodes N1 and N2 of the n-th basic circuit 113-$n$, and gate signals of basic circuits close to the n-th basic circuit according to this embodiment. The axis of abscissa in FIG. 6 represents a time. The nodes N1 and N2 of the n-th basic circuit 113-$n$ are represented as N1$_n$ and N2$_n$, respectively.

Now, as an example, the operation of the basic circuits 113 in the first period will be described below. That is, the node N2A and the node N2 are electrically connected to each other, the transistors T2A and T6A are in the drive-on state, the node N2B is maintained at the first low voltage $V_{GL}$, and the transistors T2B and T6B are in the drive off-state.

As illustrated in FIG. 4, a gate and an input terminal of a transistor T1 are connected with the input terminal IN3 (diode connection), and an output terminal of the transistor T1 is connected with the node N1. A gate signal $G_{n-2}$ from an (n−2)-th basic circuit 113-(n−2) is input to the input terminal IN3. Since the gate signal $G_{n-2}$ becomes the high voltage $V_{GH}$ in a period P1 illustrated in FIG. 6, the transistor T1 turns on at a start time of the period P1, the transistor T1 supplies the high voltage $V_{GH}$ to the node N1, and the node N1 changes from the first low voltage $V_{GL}$ to the high voltage $V_{GH}$. Since the node N1 becomes the high voltage $V_{GH}$, the transistor T5 turns on, and the transistor T5 supplies the voltage of the basic clock signal $V_n$ to the output terminal OUT.

Also, a gate of a transistor T7 is connected with the input terminal IN3, the input terminal is connected with the low voltage line $V_{GL}$, and the output terminal is connected with the node N2. Since the gate signal $G_{n-2}$ becomes the high voltage $V_{GH}$ in the period P1 illustrated in FIG. 6, the transistor T7 turns on at the start time of the period P1, the transistor T7 supplies the first low voltage $V_{GL}$ of the low voltage line $V_{GL}$ to the node N2, and the node N2 changes from the high voltage $V_{GH}$ to the first low voltage $V_{GL}$. Since the node N2 becomes the first low voltage $V_{GL}$, the transistors T2A and T6A turn off.

A gate of a transistor T4 is connected to the node N1, an input terminal of the transistor T4 is connected with the low voltage line $V_{GL}$, and an output terminal of the transistor T4 is connected to the node N2. Since the node N1 becomes the high voltage $V_{GH}$ in the period P1, the transistor T4 turns on. The transistor T4 turns on, and the transistor T4 supplies the first low voltage $V_{GL}$ of the low voltage line $V_{GL}$ to the node N2. Hence, the transistor T4 is maintained in the on-state in a period where the node N1 is the high voltage, that is, during periods P1, P2, and P3, and the node N2 is maintained at the first low voltage $V_{GL}$.

In the period P2 which is the signal high period, the node N1 is maintained at the high voltage, and the transistor T5 is maintained in the on-state. In the period P2, the basic clock signal $V_n$ becomes the high voltage $V_{GH}$. Hence, in the period P2, the high voltage $V_{GH}$ of the basic clock signal $V_n$ is output from the output terminal OUT through the transistor T5 as the gate signal G.

In this situation, in fact, because a threshold voltage $V_{th}$ is present in the transistor T1, the voltage of the node N1 becomes a voltage obtained by subtracting the threshold voltage $V_{th}$ of the transistor T1 from the high voltage $V_{GH}$ of the gate signal $G_{n-2}$ in the period P1. In the period P2 which is the signal high period, this voltage may not allow the transistor T5 to sufficiently turn on. Therefore, in the high voltage supply switching circuit 12, the boost capacitor C1 is arranged to connect the gate to the output terminal of the transistor T5. When the time becomes the period P2, the gate signal $G_{n-2}$ changes to the low voltage, and the transistor T1 turns off. However, the node N1 is maintained at the high voltage, and the transistor T5 is maintained in the on-state. In the period P2, the high voltage $V_{GH}$ of the basic clock signal $V_n$ is supplied to the output terminal OUT, and the node N1 is stepped up to a higher voltage due to a capacitive coupling of the boost capacitor C1. This is called "bootstrap voltage".

As illustrated in FIG. 4, a gate of a transistor T9 is connected with the input terminal IN4, an input terminal of the transistor T9 is connected with the low voltage line $V_{GL}$, and an output terminal of the transistor T9 is connected to the node N1. The input terminal IN4 receives a gate signal $G_{n+4}$ from an (n+4)-th basic circuits 113-(n+4). As illustrated in FIG. 6, since the gate signal $G_{n+4}$ becomes the high voltage $V_{GH}$ in a period P4, at a start time of the period P4, the transistor T9 turns on, the first low voltage $V_{GL}$ of the low voltage line $V_{GL}$ is supplied to the node N1, and the node N1 changes from the high voltage $V_{GH}$ to the first low voltage $V_{GL}$. As a result, the transistor T5 turns off. At the same time, the transistor T4 also turns off.

As illustrated in FIG. 4, a gate and an input terminal of a transistor T3 are connected with the input terminal IN2, and an output terminal of the transistor T3 is connected with the node N2. The basic clock signal $V_{n+4}$ is input to the input terminal IN2. Since the basic clock signal $V_{n+4}$ becomes the high voltage $V_{GH}$ in the period P4 illustrated in FIG. 6, at the start time of the period P4, the transistor T3 turns on, the transistor T3 supplies the high voltage $V_{GH}$ to the node N2, and the node N2 changes from the first low voltage $V_{GL}$ to the high voltage $V_{GH}$. Since the node N2 becomes the high voltage $V_{GH}$, the transistors T2A and T6A turn on. Also, a retentive capacitor C3 is arranged to connect the node N2 and the low voltage line $V_{GL}$, and the retentive capacitor C3 is charged to the high voltage $V_{GH}$ in the period P4.

Thereafter, the basic clock signal $V_{n+4}$ becomes the first low voltage $V_{GL}$ in a period P5, and even after the transistor T3 has turned off, the retentive capacitor C3 allows the voltage of the node N2 to be maintained at the high voltage $V_{GH}$. Further, the basic clock signal $V_{n+4}$ becomes periodically the high voltage $V_{GH}$, and the retentive capacitor C3 continues to be periodically charged. As a result, the voltage of the node N2 is maintained at the high voltage $V_{GH}$, and the transistors T2A and T6A are maintained in the on-state. The transistor T6A supplies the second low voltage $V_{GL2}$ which is the voltage of the AC voltage line $V_{GL\_AC3}$ to the output terminal OUT, and the gate signal $G_n$ output from the output terminal OUT is maintained at the second low voltage $V_{GL2}$ as a low voltage. Also, the transistor T2A supplies the first low voltage $V_{GL}$ which is the voltage of the AC voltage line $V_{GL\_AC2}$ to the node N1, and the node N1 is maintained at the first low voltage $V_{GL}$.

With the above configuration, in response to the signal high period, in the periods P1, P2, and P3, the node N1 becomes the high voltage, and the transistor T5 which is the high voltage supply switching element turns on, and the voltage of the basic clock signal $V_n$ is supplied to the output terminal OUT. In the other period, the transistor T5 turns off. Also, in the periods P1, P2, and P3, the node N2 becomes the first low voltage $V_{GL}$, and in the other period, the node N2 becomes the high voltage $V_{GH}$.

Figure 7:
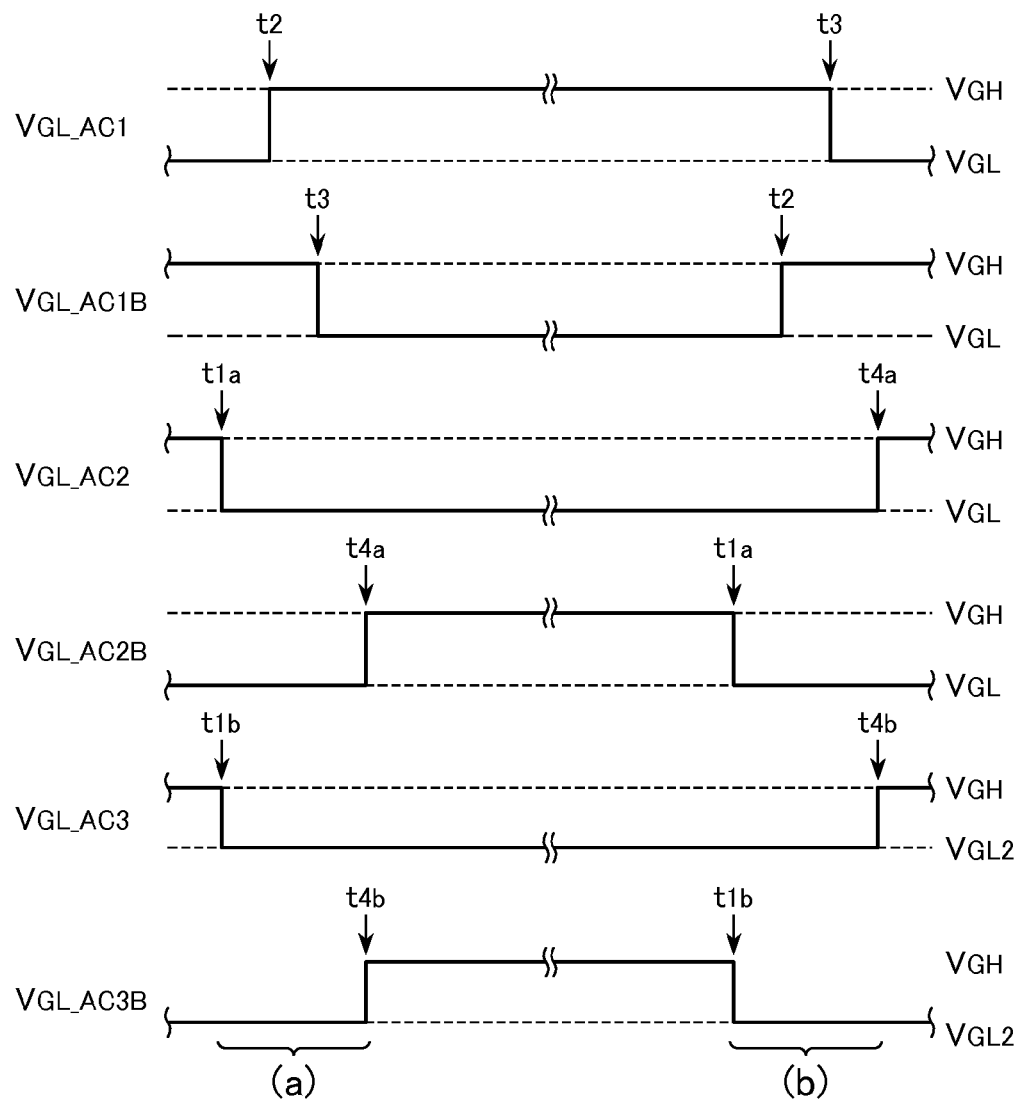
FIG. 7 is a diagram illustrating a time change of voltages of three pairs of AC voltage lines according to the first embodiment of the invention.

FIG. 7 is a diagram illustrating a time change of the voltage of three pairs of AC voltage lines according to this embodiment. In the time change of the voltage of the three pairs of AC voltage lines illustrated in FIG. 5, periods close to (a) and (b) indicated by dashed lines in FIG. 5 are illustrated in detail. In this example, (a) shows a switching timing from the second period to the first period, and (b) shows a switching timing from the first period to the second period. Respective times indicated by arrows in FIG. 7 are defined as t1a, t1b, t2, t3, t4a, and t4b. In this example, the times t1a and t1b are the same time, and the times t4a and t4b are the same time.

First, switching from the second period to the first period ((a) shown in FIG. 7) will be described.

As described above, in the second period, the AC voltage lines $V_{GL\_AC1}$ and $V_{GL\_AC2B}$ are the first low voltage $V_{GL}$, the AC voltage line $V_{GL\_AC3B}$ is the second low voltage $V_{GL2}$, and the AC voltage lines $V_{GL\_AC1B}$, $V_{GL\_AC2}$, and $V_{GL\_AC3}$ are the high voltage $V_{GH}$. In the second period, the node N2B is connected to the node N2, and the node N2A is maintained at the first low voltage $V_{GL}$. Therefore, the transistors T2B and T6B are in the drive on-state, and the transistors T2A and T6A are in the drive off-state.

First, at the time t1a, the AC voltage line $V_{GL\_AC2}$ changes from the high voltage $V_{GH}$ to the first low voltage $V_{GL}$. As a result, the voltage which is supplied to the input terminal of the transistor T2A changes to the first low voltage $V_{GL}$. Also, at the time t1b which is the same time as the time t1a, the AC voltage line $V_{GL\_AC3}$ changes from the high voltage $V_{GH}$ to the second low voltage $V_{GL2}$. As a result, the voltage which is supplied to the input terminal of the transistor T6A changes to the second low voltage $V_{GL2}$. Behind that timing, at the time t2, the AC voltage line $V_{GL\_AC1}$ changes from the first low voltage $V_{GL}$ to the high voltage $V_{GH}$. As a result, the transistor TA1 turns on, and the node N2 is connected to the node N2B as well as the node N2A. Also, a voltage that is supplied to the input terminal of the transistor TA2 of the on-state changes to the high voltage $V_{GH}$ due to the high voltage $V_{GH}$ of the AC voltage line $V_{GL\_AC1B}$. Before the time t2, the node N2A is the first low voltage $V_{GL}$. If the node N2 of the high voltage $V_{GH}$ is merely connected to the node N2A by turning on the transistor TA1, the voltage of the node N2 is largely lowered. However, since the node N2A changes from the first low voltage $V_{GL}$ to the high voltage $V_{GH}$ by means of the transistor TA2, the lowering of the voltage at the node N2 is suppressed at the time t2. Then, the node N2A is connected to the node N2 with the results that the transistors T2B and T6B as well as the transistors T2A and T6A become in the drive on-state. Also, at the time t2, the transistor TA4 also turns on, and the transistor TA4 supplies the high voltage $V_{GH}$ of the AC voltage line $V_{GL\_AC1B}$ to the node N2B. For that reason, the lowering of the voltage at the node N2 at the time t2 is further suppressed.

Subsequently, at the time t3, the AC voltage line $V_{GL\_AC1B}$ changes from the high voltage $V_{GH}$ to the first low voltage $V_{GL}$. As a result, the transistor TA3 also turns off, and the node N2B is isolated from the node N2. Also, the transistor TA2 also turns off, the node N2A is isolated from the AC voltage line $V_{GL\_AC1}$. Further, since the voltage that is supplied to the input terminal of the transistor TA4 which becomes on from the time t2 changes to the first low voltage $V_{GL}$, the node N2B changes from the high voltage $V_{GH}$ to the first low voltage $V_{GL}$, and the transistors T2B and T6B turn off, and thereafter become in the drive off-state where those transistors T2B and T6B are maintained in the off-state.

Thereafter, at the time t4a, the AC voltage line $V_{GL\_AC2B}$ changes from the first low voltage $V_{GL}$ to the high voltage $V_{GH}$. As a result, the voltage that is supplied to the input terminal of the transistor T2B changes to the high voltage $V_{GH}$. Also, at the time t4b which is the same time as the time t4a, the AC voltage line $V_{GL\_AC3B}$ changes from the second low voltage $V_{GL2}$ to the high voltage $V_{GH}$. As a result, the voltage which is supplied to the input terminal of the transistor T6B changes to the high voltage $V_{GH}$.

The switching from the second period to the first period ((a) shown in FIG. 7) has been described above. The same is supplied to the switching from the first period to the second period ((b) shown in FIG. 7). At the time t1a (t1b), the voltage which is supplied to the input terminal of the transistor T2B changes to the first low voltage $V_{GL}$, and the voltage which is supplied to the input terminal of the transistor T6B changes to the second low voltage $V_{GL2}$. Thereafter, at the time t2, the transistors TA2 and TA3 turn on, and the node N2B is connected to the node N2, and changes to the high voltage $V_{GH}$ with the result that the transistors T2B and T6B become in the driven on-state. Subsequently, at the time t3, the transistors TA1 and TA4 turn off, and the node N2A is isolated from the node N2, and changes to the first low voltage $V_{GL}$ with the result that the transistors T2A and T6A become in the drive off-state. Thereafter, at the time t4a (t4b), the voltage that is supplied to the input terminal of the transistor T2A changes to the high voltage $V_{GH}$, and the voltage that is supplied to the input terminal of the transistor T6A changes to the high voltage $V_{GH}$.

Prior to the timing when the transistor TA3 (TA1) turns off at the time t3, the transistor TA1 (TA3) turns on at the time t2 with the result that the voltages of the node N1 and the output terminal OUT are stably maintained even at the time of switching operation. Prior to the timing when the transistor TA1 (TA3) turns on at the time t2, the first low voltage $V_{GL}$ is supplied to the input terminal of the transistor T2A (T2B) at the time t1a, and the second low voltage $V_{GL2}$ is supplied to the input terminal of the transistor T6A (T6B) at the time t1b. As a result, the voltage that is supplied to the input terminal can be stabilized before the transistors T2A and T6A (T2B and T6B) become in the drive on-state. Also, after the timing when the transistor TA3 (TA1) turns off at the time t3, the high voltage $V_{GH}$ is supplied to the input terminal of the transistor T2B (T2A) at the time t4a, and the high voltage $V_{GH}$ is supplied to the input terminal of the transistor T6B (T6A) at the time t4b. As a result, the voltage that is supplied to the input terminal can be changed after the transistors T2B and T6B (T2A, T6A) have stably become in the off-state. The times t1a and t1b do not always need to match each other at timing before the time t2, and the times t4a and t4b do not always need to match each other at timing after the time t3.

The gate signal line drive circuit according to this embodiment has been described above. The main features of the gate signal line drive circuit according to the invention reside in that in order to maintain the high voltage supply switching element in the off-state in response to the signal low period, the high voltage supply off control circuit supplies the first low voltage to the switch (control terminal: gate) of the high voltage supply switching element (transistor T5), and the low voltage supply switching circuit supplies the second low voltage to the gate signal line (output terminal OUT) in response to the signal low period. In this example, the second low voltage is higher than the first low voltage. According to the gate signal line drive circuit of the invention, the first low voltage is supplied to the switch of the high voltage supply switching element, and the second low voltage is supplied to the output terminal of the high voltage supply switching element in response to the signal low period, to thereby suppress the leak current of the high voltage supply switching element and realize a reduction in the power consumption.

Also, the high voltage supply off control circuit provided in the gate signal line drive circuit according to the invention includes the first and second high voltage supply off control elements (transistors T2A, T2B) arranged in parallel to the control terminal (switch) of the high voltage supply switching element. The low voltage supply switching circuit provided in the gate signal line drive circuit according to the invention includes the first and second low voltage supply switching elements (transistors T6A, T6B) arranged in parallel to the gate signal line. Hence, as described above, a time when the high voltage is supplied to the switch (gate) is shared by a plurality of elements while suppressing the leak current of the high voltage supply switching element. With the above configuration, the deterioration of the elements is suppressed, and a long lifetime of the gate signal line drive circuit and the display having the gate signal line drive circuit is realized.

Figure 8A:
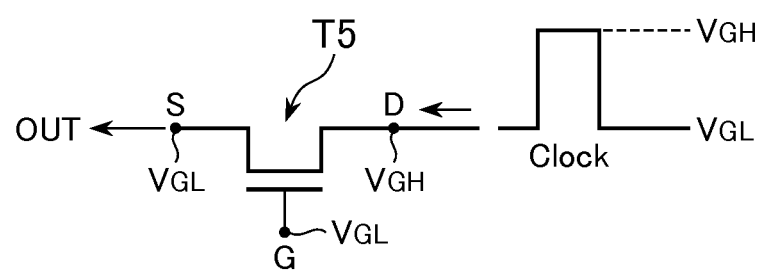
FIGS. 8A and 8B are schematic diagrams illustrating an example of an off-operating point of a transistor.
Figure 8B:
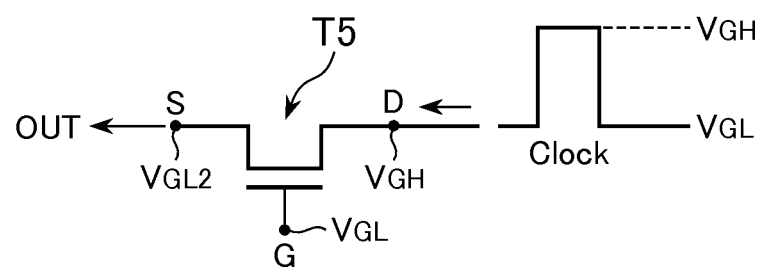

FIGS. 8A and 8B are schematic diagrams illustrating an example of an off-operating point of the transistor. FIG. 8A illustrates a case in which the first low voltage $V_{GL}$ of the same potential is supplied to both of a gate G and a source S (output terminal) of the transistor. FIG. 8B illustrates a case in which the first low voltage $V_{GL}$ is supplied to the gate G of the transistor, and the second low voltage $V_{GL2}$ is supplied to the source S (output terminal) (binary low voltage values). The transistor illustrated in FIGS. 8A and 8B is, for example, the transistor T5 which is the high voltage supply switching element. A basic clock signal Clock that alternately repeats the first low voltage $V_{GL}$ and the high voltage $V_{GH}$ is input to a drain D (input terminal) of the transistor. When the transistor is on, the voltage of the basic clock signal Clock is output to the output terminal OUT. The transistor illustrated in FIG. 8A corresponds to the transistor T5, for example, shown in FIG. 4 of JP 2010-256422 A, and the transistor illustrated in FIG. 8B corresponds to the transistor T5 of this embodiment. When the transistor is off (off operating point), and the high voltage $V_{GH}$ of the basic clock signal Clock is supplied to the drain D of the transistor, the voltages to be supplied to three poles of the transistor are illustrated in FIGS. 8A and 8B.

In this example, the voltage of the gate with respect to the source of the transistor is defined as a gate/source voltage $V_{GS}$, and the voltage of the drain with respect to the source is defined as a drain/source voltage $V_{DS}$. Also, in this example, it is assumed that the high voltage $V_{GH}$ is +15V, the first low voltage $V_{GL}$ is −14V, and the second low voltage $V_{GL2}$ is −12V. in the case illustrated in FIG. 8A, the gate/source voltage $V_{GS}$ of the transistor is 0V, and the drain/source voltage $V_{DS}$ of the transistor is +29V. On the contrary, in the case illustrated in FIG. 8B, the gate/source voltage $V_{GS}$ of the transistor is −2V (=−ΔV), and the drain/source voltage $V_{DS}$ is +27V.

Figure 9:
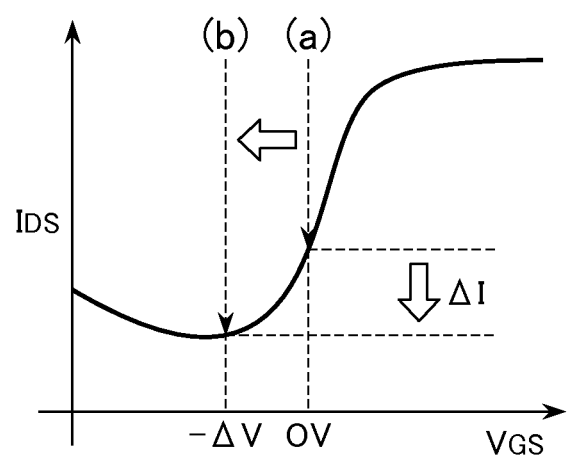
FIG. 9 is a diagram illustrating a current characteristic of the transistor.

FIG. 9 is a diagram illustrating a current characteristic of the transistor. A drain/source current $I_{DS}$ with respect to the gate/source voltage $V_{GS}$ is illustrated in FIG. 9. As illustrated in FIG. 9, the drain/source current $I_{DS}$ is reduced more as the gate/source voltage $V_{GS}$ is gradually reduced more from a positive value. The drain/source current $I_{DS}$ has a finite value even in a normal off-operating point where the gate/source voltage $V_{GS}$ becomes 0V ((a) in FIG. 9). As the gate/source voltage $V_{GS}$ is gradually decreased further from 0 (an absolute value of the voltage is increased), the drain/source current $I_{DS}$ is decreased. Then, when the gate/source voltage $V_{GS}$ is −ΔV, the drain/source current $I_{DS}$ becomes extremely small. When the gate/source voltage $V_{GS}$ is further decreased (the absolute value of the voltage is increased), the drain/source current $I_{DS}$ is gently increased. Hence, in order to reduce the leak current when the transistor is off, it is desirable that the gate/source voltage $V_{GS}$ is negative. Further, it is most preferable that the gate/source voltage $V_{GS}$ takes the voltage $-\Delta V$ where the drain/source current $I_{DS}$ becomes extremely small. In this embodiment, when the first low voltage $V_{GL}$ is −14V, and the second low voltage $V_{GL2}$ is −12V, if the transistor T5 is off, the gate/source voltage $V_{GS}$ of the transistor T5 can be set to the most desirable voltage value ($-\Delta V$=−2V). As a result, the leak current of the transistor T5 can be suppressed, and a reduction in the power consumption can be realized. In FIG. 9, a reduction in the drain/source current $I_{DS}$ when the gate/source voltage $V_{GS}$ is reduced from 0V to $-\Delta V$ is indicated as AI. A voltage difference between the first low voltage $V_{GL}$ and the second low voltage $V_{GL2}$ may be determined according to the current characteristic of the transistor in question.

The gate signal line drive circuit 104 according to this embodiment further includes the transistor TA4 (first control switching element) and the transistor TA2 (second control switching element). In the first period where the first high voltage supply off control element (transistor T2A) and the first low voltage supply switching element (transistor T6A) become in the drive on-state, the transistor TA4 of the on-state supplies the first low voltage $V_{GL}$ to the node N2B isolated from the node N2 by the transistor TA3. Also, in the second period where the second high voltage supply off control element (transistor T2B) and the second low voltage supply switching element (transistor T6B) become in the drive on-state, the transistor TA2 of the on-state supplies the first low voltage $V_{GL}$ to the node N2A isolated from the node N2 by the transistor TA1. In the first period, the node N2B is maintained at the first low voltage $V_{GL}$ so that the gate/source voltage $V_{GS}$ of the transistor T6B becomes negative as with the transistor T5. Also, in the second period, the node N2A is maintained at the first low voltage $V_{GL}$ so that the gate/source voltage $V_{GS}$ of the transistor T6A becomes negative as with the transistor T5.

In this embodiment, when the transistor T6A (T6B) is in the drive off-state, the high voltage $V_{GH}$ is supplied to the drain D (input terminal) of the transistor T6A (T6B). That is, a reverse bias voltage is supplied to the transistor T6A (T6B). This is because the threshold voltage $V_{th}$ shifted to a positive side while the transistor T6A (T6B) is in the drive on-state is recovered (the threshold voltage $V_{th}$ is shifted to a negative side) while the transistor T6A (T6B) is in the drive off-state. In the gate signal line drive circuit 104 according to this embodiment, the gate/source voltage $V_{GS}$ of the transistor T6A (T6B) which is in the drive off-state is negative. As a result, the leak current generated in the transistor T6A (T6B) can be also suppressed while an increase in the threshold voltage $V_{th}$ of the transistor T6A (T6B) is suppressed.

Second Embodiment

A gate signal line drive circuit according to a second embodiment of the invention is identical with the gate signal line drive circuit according to the first embodiment except that the voltages of the AC voltage lines connected to the shift register circuit 112 are different from each other.

As illustrated in FIG. 5, the pair of AC voltage lines $V_{GL\_AC2}$ and $V_{GL\_AC2B}$ (first voltage line, second voltage line) according to the first embodiment alternately repeat the high voltage $V_{GH}$ and the first low voltage $V_{GL}$. On the contrary, the pair of AC voltage lines $V_{GL\_AC2}$ and $V_{GL\_AC2B}$ (first voltage line, second voltage line) according to the embodiment alternately repeat an intermediate voltage and the first low voltage $V_{GL}$. In this example, the intermediate voltage is directed to a voltage higher than the first low voltage $V_{GL}$ and lower than the high voltage $V_{GH}$. That is, in the first period where the transistor T2A becomes in the drive on-state, and the transistor T2B becomes in the drive off-state, the intermediate voltage is supplied to the AC voltage line $V_{GL\_AC2B}$ (second voltage line). In the second period where the transistor T2B becomes in the drive on-state and the transistor T2A becomes in the drive off-state, the intermediate voltage is supplied to the AC voltage line $V_{GL\_AC2}$ (first voltage line). For example, when the high voltage $V_{GH}$ is +15V, and the first low voltage $V_{GL}$ is −14V, it is desirable that the intermediate voltage is a ground voltage GND (=0V). When the transistor T2A (T2B) is in the drive off-state, the first low voltage $V_{GL}$ which is a voltage of the node N2A (N2B) is supplied to the gate of the transistor T2A (T2B), and the first low voltage $V_{GL}$ at the node N1 is supplied to the source (output terminal) of the transistor T2A (T2B) in response to the signal low period. In this situation, the gate/source voltage $V_{GS}$ of the transistor T2A (T2B) is 0V. In the first embodiment, the high voltage $V_{GH}$ of the AC voltage line $V_{GL\_AC2}$ ($V_{GL\_AC2B}$) is supplied to the drain (input terminal) of the transistor T2A (T2B), and a leak current in the transistor T2A (T2B) is problematic. However, in the second embodiment, the voltage to be supplied to the drain (input terminal) of the transistor T2A (T2B) is the intermediate voltage (lower than the high voltage $V_{GH}$) of the AC voltage lines $V_{GL\_AC2}$ ($V_{GL\_AC2B}$). The reverse bias voltage is reduced to more suppress the leak current in the transistor T2A (T2B) as compared with the first embodiment while suppressing an increase in the threshold voltage $V_{th}$.

In this example, the intermediate voltage can be determined taking the power consumption into account in addition to the effect of recovering the threshold voltage $V_{th}$ shifted to the positive side. The recovery speed of the threshold voltage $V_{th}$ can be higher as the reverse bias voltage is larger. However, the necessary recovery speed is determined in view of the shift amount of the threshold voltage $V_{th}$ and a length of period during which the transistor is in the drive off-state which becomes a recovery time. From this viewpoint, the voltage of the AC power line to be supplied to the transistor in the period of the drive off-state may be the intermediate voltage lower than the high voltage $V_{GH}$. On the other hand, in order to reduce the power consumption, it is effective to reduce an amplitude of the AC power line as one manner. From this viewpoint, it is preferable that the intermediate voltage is set to be lower, and a potential difference from the first low voltage $V_{GL}$ is reduced. As another manner, there is a viewpoint of an energy conversion efficiency when generating the intermediate voltage. Since the energy is consumed to generate the intermediate voltage, if the ground voltage GND (=0V) is the intermediate voltage between the high voltage $V_{GH}$ and the first low voltage $V_{GL}$, it is desirable to set the intermediate voltage to the ground voltage GND from the viewpoint of the power consumption. Also, if the voltage to be supplied to the transistor in the period of the drive off-state is the intermediate voltage, since the reverse bias voltage is reduced, it is desirable to provide a longer recovery time of the threshold voltage $V_{th}$ of the transistor of the drive off-state. When the intermediate voltage is the ground voltage GND, it is desirable that the first period and the second period are set to a 32-frame period or longer, that is, it is desirable that the first given number and the second given number are each set to 32 or more. The first given number and the second given number do not always match each other, but it is desirable that the first given number is equal to the second given number from the viewpoint of a load exerted on the element.

Further, the pair of AC voltage lines $V_{GL\_AC3}$, $V_{GL\_AC3B}$ (third voltage line, fourth voltage line) may alternately repeat the intermediate voltage and the second low voltage $V_{GL2}$. As described above, in the transistor T6A (T6B) of the drive off-state, the gate/source voltage $V_{GS}$ is negative. In the drive off-state, when the reverse bias voltage to be supplied to the transistor T6A (T6B) is reduced so that the leak current in the transistor T6A (T6B) can be further reduced.

Third Embodiment

A gate signal line drive circuit according to a third embodiment of the invention is identical with the gate signal line drive circuit according to the first embodiment except that the AC voltage lines connected to the shift register circuit 112 are different from each other.

Figure 10:
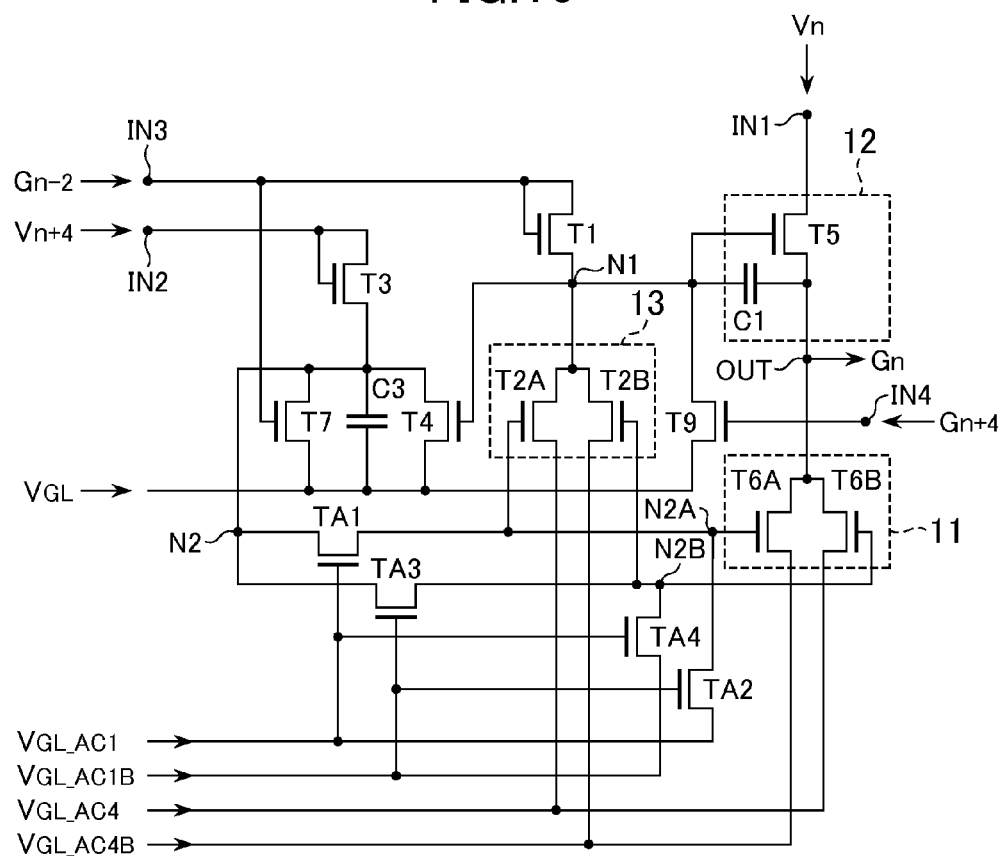
FIG. 10 is a diagram illustrating respective time changes of four-phase basic clock signals, nodes N1 and N2 of an n-th basic circuit, and gate signals of basic circuits close to the n-th basic circuit according to a third embodiment of the invention.

FIG. 10 is a circuit diagram of the n-th basic circuit 113-n according to this embodiment. In the n-th basic circuit 113-n according to the first embodiment illustrated in FIG. 4, the pair of AC voltage lines $V_{GL\_AC2}$ and $V_{GL\_AC2B}$ connected to the high voltage supply off control circuit 13, and the pair of AC voltage lines $V_{GL\_AC3}$ and $V_{GL\_AC3B}$ connected to the low voltage supply switching circuit 11 are disposed, separately. On the contrary, as illustrated in FIG. 10, in the n-th basic circuit 113-n according to this embodiment, a pair of AC voltage lines $V_{GL\_AC4}$ and $V_{GL\_AC4B}$ are disposed. The AC voltage line $V_{GL\_AC4}$ is connected to both of the input terminal of the transistor T2A which is the first high voltage supply off control element, and the input terminal of the transistor T6B which is the second low voltage supply switching element. Also, the AC voltage line $V_{GL\_AC4B}$ is connected to both of the input terminal of the transistor T2B which is the second high voltage supply off control element, and the input terminal of the transistor T6A which is the first low voltage supply switching element. That is, the second voltage line connected to the input terminal of the transistor T2B is connected to the third voltage line connected to the input terminal of the transistor T6A. The fourth voltage line connected to the input terminal of the transistor T6B is connected to the first voltage line connected to the input terminal of the transistor T2A.

Figure 11:
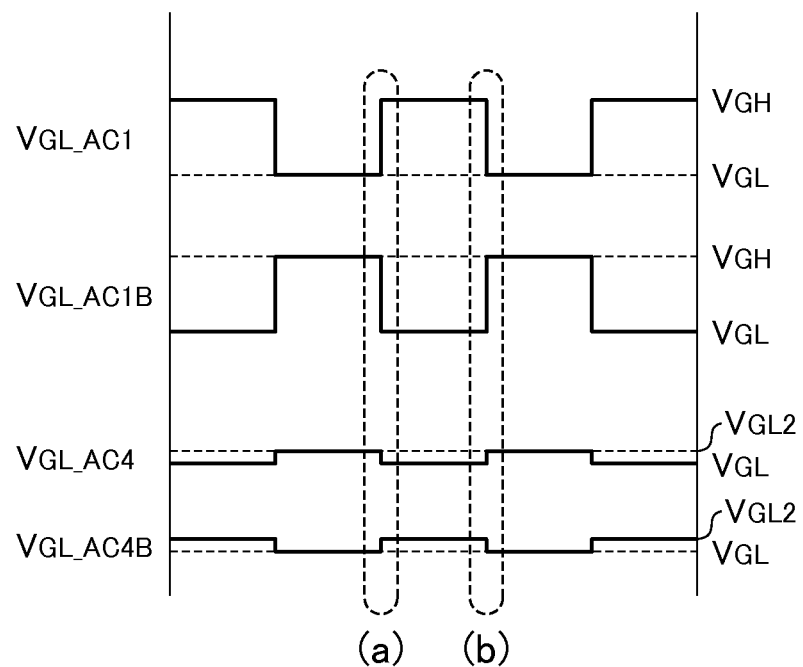
FIG. 11 is a diagram illustrating a time change of voltages of two pairs of AC voltage lines according to the third embodiment of the invention.

FIG. 11 is a diagram illustrating a time change of voltages of two pairs of AC voltage lines according to this embodiment. An axis of abscissa in FIG. 11 represents a time. The pair of AC voltage lines $V_{GL\_AC1}$ and $V_{GL\_AC1B}$ are the same AC voltage lines as the pair of AC voltage lines $V_{GL\_AC1}$ and $V_{GL\_AC1B}$ in the first embodiment illustrated in FIGS. 5 and 6. The pair of AC voltage lines $V_{GL\_AC4}$ and $V_{GL\_AC4B}$ switches the voltage at the same timing as that of the pair of AC voltage lines $V_{GL\_AC2}$ and $V_{GL\_AC2B}$ in the first embodiment illustrated in FIGS. 5 and 6. The pair of AC voltage lines $V_{GL\_AC4}$ and $V_{GL\_AC4B}$ alternately repeat the second low voltage $V_{GL2}$ and the first low voltage $V_{GL}$.

The gate signal line drive circuit 104 according to the first and second embodiments outputs the gate signal to the corresponding gate signal lines 105 with the use of the three pairs of AC power lines. On the other hand, the gate signal line drive circuit 104 according to this embodiment realizes output of the gate signal with the use of the two pairs of AC power lines. That is, there is no need to provide wiring necessary for the pair of AC power lines, and a circuit width can be reduced. That is, as compared with the first and second embodiments, a circuit scale can be reduced, and a narrower frame and higher fineness can be realized.

Fourth Embodiment

A gate signal line drive circuit according to a fourth embodiment of the invention is identical with the gate signal line drive circuit according to any one of the first to third embodiments except that the input basic clock signal is different from each other.

As a result of study, the inventors have obtained knowledge that the low voltage of the gate signal output by the gate signal line drive circuit 104 according to the first to third embodiments fluctuates in periods before and after the signal high period, to thereby increase the power consumption. That is, as illustrated in FIG. 6, for example, in the gate signal $G_n$, a low voltage fluctuation $\Delta VF1$ is generated in the period P1 which is one previous period from the period P2 which is the signal high period, and a low voltage fluctuation $\Delta VF2$ is generated in the period P3 which is a period next to the period P2. This will be described.

Figure 12:
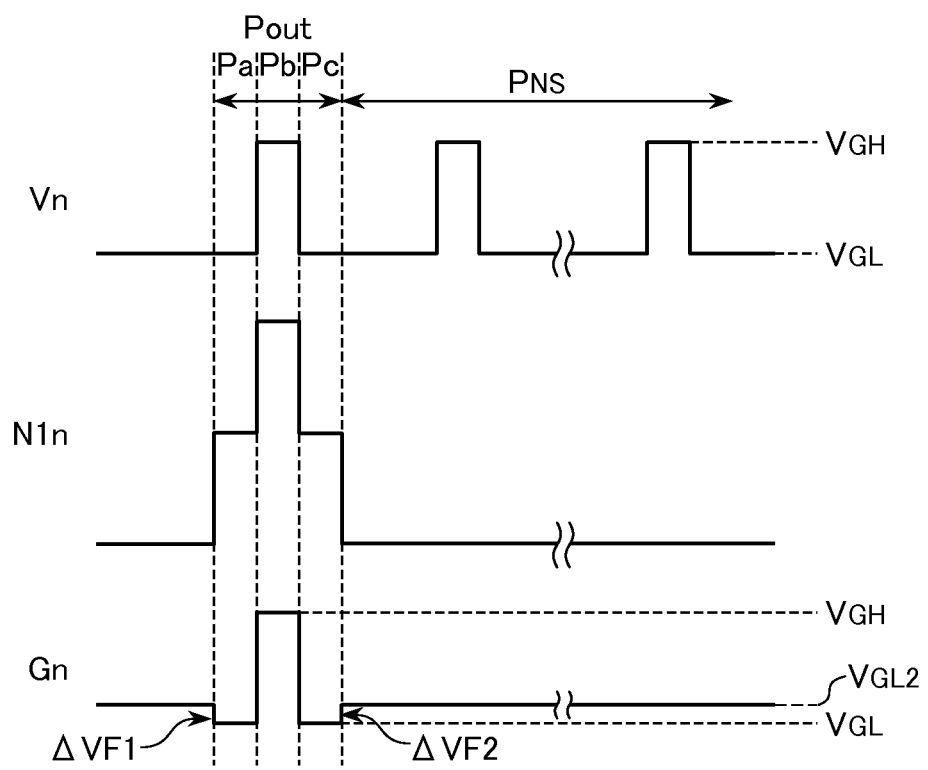
FIG. 12 is a diagram illustrating time changes of the basic clock signal, the node N1 of the n-th basic circuit, and the gate signal according to the first embodiment of the invention.

FIG. 12 is a diagram illustrating time changes of the basic clock signal $V_n$, the node N1 of the n-th basic circuit 113-n, and the gate signal $G_n$ according to the first embodiment. The axis of abscissa in FIG. 12 represents a time. The node N1 of the n-th basic circuit 113-n is denoted by $N1_n$. In FIG. 12, a period when the transistor T5 which is the high voltage supply switching element is on is represented by a period $P_{out}$, and a period when the transistor T5 is off is represented by a period $P_{NS}$. The period $P_{out}$ can be regarded as a period in which the node N1 is high voltage, and the period $P_{NS}$ can be regarded as a period in which the node N1 is low voltage (first low voltage $V_{GL}$). Also, the period $P_{out}$ includes periods Pa, Pb, and Pc, and those respective periods correspond to the periods P1, P2, and P3 illustrated in FIG. 6.

As described above, the basic clock signal $V_n$ input to the input terminal IN1 of the n-th basic circuit 113-n is one clock signal of the four-phase basic clock signals. FIG. 12 more generally illustrates one clock signal of m-phase (integer of m≥3) basic clock signals. That is, the basic clock signal $V_n$ is a repetitive clock signal with m clocks as one cycle, and alternately repeats the high voltage $V_{GH}$ and the first low voltage $V_{GL}$.

As illustrated in FIG. 6, in a period before the period P1 (period Pa in FIG. 12), the node N1 is maintained at the first low voltage $V_{GL}$, and the node N2 is maintained at the high voltage $V_{GH}$. The low voltage supply switching circuit 11 outputs the second low voltage $V_{GL2}$ as the low voltage of the gate signal $G_n$. On the contrary, at a start time of the period P1 (period Pa shown in FIG. 12) illustrated in FIG. 6, the node N1 changes from the first low voltage $V_{GL}$ to the high voltage $V_{GH}$, and the node N2 changes from the high voltage $V_{GH}$ to the first low voltage $V_{GL}$. With the above operation, the low voltage supply switching circuit 11 turns off, and the transistor T5 which is the high voltage supply switching element turns on. The transistor T5 outputs the first low voltage $V_{GL}$ of the basic clock signal $V_n$ as the low voltage of the gate signal $G_n$ in the period P1 (period Pa). That is, the low voltage in the period Pa is the first low voltage $V_{GL}$, and different from the second low voltage $V_{GL2}$ which is the low voltage in a period before the period Pa, and the low voltage fluctuation $\Delta VF1$ is generated.

Likewise, in the period P3 (period Pc shown in FIG. 12) shown in FIG. 6, the transistor T5 outputs the first low voltage $V_{GL}$ of the basic clock signal $V_n$ as the low voltage of the gate signal $G_n$ in the period P1 (period Pa). At a start time of the period P4 illustrated in FIG. 6, the node N1 changes from the high voltage $V_{GH}$ to the first low voltage $V_{GL}$, and the node N2 changes from the first low voltage $V_{GL}$ to the high voltage $V_{GH}$. With the above operation, the transistor T5 turns off, the low voltage supply switching circuit 11 (transistor of the drive on-state in the transistors T6A and T6B) turns on, and the low voltage supply switching circuit 11 outputs the second low voltage $V_{GL2}$ as the low voltage of the gate signal $G_n$ in the period P4 (and a subsequent period) illustrated in FIG. 6. That is, the low voltage in the period Pc is the first low voltage $V_{GL}$, and different from the second low voltage $V_{GL2}$ which is the low voltage in a period after the period Pc, and the low voltage fluctuation ΔVF2 is generated.

The low voltage fluctuations ΔVF1 and ΔVF2 are generated in the low voltage of the gate signal $G_n$, to thereby increase the power consumption. Parasitic capacitances are formed, for example, at portions where the gate signal lines 105 and other signal lines intersect with each other. The voltage fluctuation of the gate signal induces charging of the above parasitic capacitances, resulting in an increase in the power consumption. Also, in fact, since the voltages of the nodes N1 and N2 are gradually changed over a finite period, the low voltage supply switching circuit 11 (transistor of the drive on-state in the transistors T6A and T6B) gradually turns off while the transistor T5 gradually turns on, for example, from a start time of the period Pa. In this period, the AC voltage line that supplies the second low voltage $V_{GL2}$, and the basic clock signal $V_n$ that supplies the first low voltage $V_{GL}$ are electrically connected to each other through the transistor T5 and the low voltage supply switching circuit 11. As a result, an unnecessary current flows, and the power consumption is increased.

Figure 13:
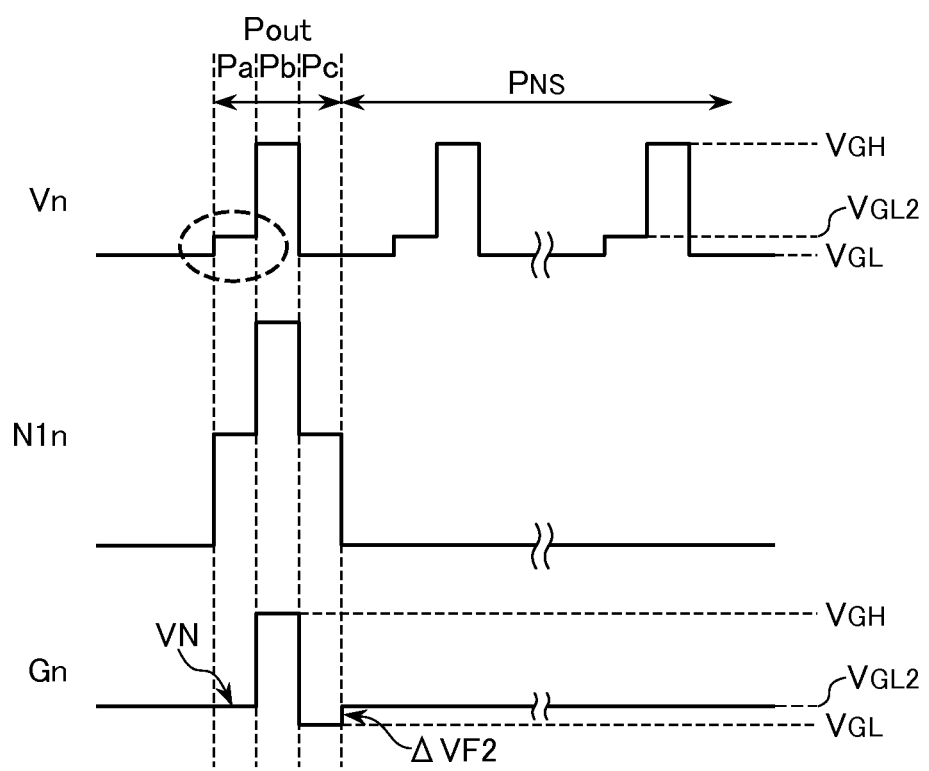
FIG. 13 is a diagram illustrating time changes of a basic clock signal, a node N1 of an n-th basic circuit, and a gate signal according to a fourth embodiment of the invention.

FIG. 13 is a diagram illustrating time changes of the basic clock signal $V_n$, the node N1 of the n-th basic circuit 113-n, and the gate signal $G_n$ according to this embodiment. The basic clock signal $V_n$ according to this embodiment is different in a clock waveform from the basic clock signal $V_n$ according to the first embodiment illustrated in FIG. 12. The basic clock signal $V_n$ according to this embodiment is an m-phase (integer of m≥3) clock signal, and which repeats with the m-clock as one cycle. A clock (clock corresponding to the period Pb) which is the high voltage $V_{GH}$ among them clocks configuring one cycle is set as a first clock. Then, one previous clock (clock corresponding to the period Pa) of the first clock is set as a second clock, and one next clock (clock corresponding to the period Pc) to the first clock is set as a third clock. The basic clock signal $V_n$ according to this embodiment becomes the high voltage $V_{GH}$ in the first clock, becomes the second low voltage $V_{GL2}$ in the second clock as surrounded by a dashed line in FIG. 13, and becomes the first low voltage $V_{GL}$ in (m−2) clocks other than the first and second clocks. As described above, the transistor T5 is on in the period Pa, and the transistor T5 outputs the second low voltage $V_{GL2}$ of the basic clock signal $V_n$ as the low voltage of the gate signal $G_n$ in the period Pa. Hence, the voltage fluctuation generated in the period Pa is suppressed, and the low voltage of the gate signal $G_n$ is held by a normal voltage $V_N$ (second low voltage $V_{GL2}$). The low voltage fluctuation generated in the period Pa is suppressed to reduce the power consumption.

The advantages of the invention have been described above from the viewpoints of the power consumption in the gate signal line circuit. Also, the remarkable advantages are obtained in the quality improvement of an image displayed by the liquid crystal display device. When the basic clock signal $V_n$ is the basic clock signal illustrated in FIG. 12, the low voltage of the gate signal $G_n$ is the first low voltage $V_{GL}$ in the period Pa. At a start time of the period Pb, the gate signal $G_n$ changes from the low voltage to the high voltage $V_{GH}$ (gate signal $G_n$ rises). Due to the low voltage fluctuation ΔVF1, the rising of the gate signal $G_n$ starts from the first low voltage $V_{GL}$ which is a voltage lower than the second low voltage $V_{GL2}$. Hence, the rising of the gate voltage to be supplied to the gate of the TFT 109 in the pixel circuit through the corresponding gate signal line 105 is delayed, and the voltage of the image signal to be supplied to the image signal lines 107 cannot be sufficiently supplied to the pixel electrode 110, thereby causing the quality of the displayed image to be degraded. On the contrary, since the gate signal $G_n$ according to this embodiment is maintained at the second low voltage $V_{GL2}$ in the period Pa, the rising of the gate signal $G_n$ starts from the second low voltage $V_{GL2}$. Hence, a delay of the rising of the gate voltage to be supplied to the gate of the TFT 109 in the pixel circuit is suppressed, and the quality of the displayed image is improved.

Fifth Embodiment

A gate signal line drive circuit according to a fifth embodiment of the invention is identical with the gate signal line drive circuit according to anyone of the first to third embodiments except that the input basic clock signal is different from each other.

Figure 14:
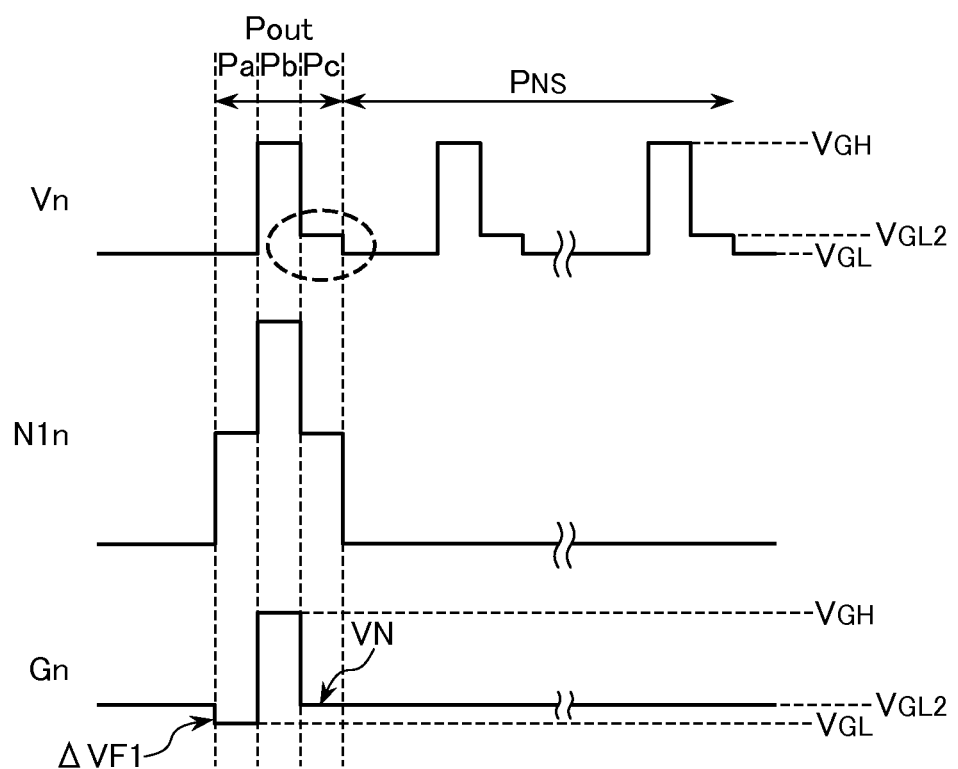
FIG. 14 is a diagram illustrating time changes of a basic clock signal, a node N1 of an n-th basic circuit, and a gate signal according to a fifth embodiment of the invention.

FIG. 14 is a diagram illustrating time changes of the basic clock signal $V_n$, the node N1 of the n-th basic circuit 113-n, and the gate signal $G_n$ according to this embodiment. The basic clock signal $V_n$ according to this embodiment is different in a clock waveform from the basic clock signal $V_n$ according to the first embodiment illustrated in FIG. 12. The basic clock signal $V_n$ according to this embodiment becomes the high voltage $V_{GH}$ in the first clock, becomes the second low voltage $V_{GL2}$ in the third clock which is a clock next to the first clock as surrounded by a dashed line in FIG. 14, and becomes the first low voltage $V_{GL}$ in (m−2) clocks other than the first and third clocks. As described above, the transistor T5 is on in the period Pc, and the transistor T5 outputs the second low voltage $V_{GL2}$ of the basic clock signal $V_n$ as the low voltage of the gate signal $G_n$ in the period Pc. Hence, the voltage fluctuation generated in the period Pc is suppressed, and the low voltage of the gate signal $G_n$ is held by the normal voltage $V_N$ (second low voltage $V_{GL2}$). The low voltage fluctuation generated in the period Pc is suppressed to reduce the power consumption.

The advantages of the invention have been described above from the viewpoints of the power consumption in the gate signal line circuit. Also, the remarkable advantages are obtained in the quality improvement of an image displayed by the liquid crystal display device. The capacitance is formed between the gate and the source of the TFT 109 in the pixel circuit. In this example, the source of the TFT 109 is connected to the pixel electrode 110. When the gate signal $G_n$ changes from the high voltage $V_{GH}$ to the low voltage at the start time of the period Pc, a leak current flows in the TFT 109 due to coupling of the above capacitance, and the voltage of the pixel electrode 110 drops. The above voltage drop is called "jump voltage". When the basic clock signal $V_n$ is a basic clock signal illustrated in FIG. 12, the low voltage of the gate signal $G_n$ is the first low voltage $V_{GL}$ in the period Pc. That is, the gate signal $G_n$ changes from the high voltage $V_{GH}$ to the first low voltage $V_{GL}$ at the start time of the period Pc. Due to the low voltage fluctuation ΔVF2, a voltage change of the gate signal $G_n$ at the start time of the period Pc becomes large, and the jump voltage also becomes large, to thereby lead to the degradation of the displayed image. On the contrary, since the gate signal $G_n$ according to this embodiment is maintained at the second low voltage $V_{GL2}$ in the period Pc, the jump voltage is reduced, and the quality of the displayed image is improved.

Sixth Embodiment

A gate signal line drive circuit according to a sixth embodiment of the invention is identical with the gate signal line drive circuit according to any one of the first to third embodiments except that the input basic clock signal is different from each other.

Figure 15:
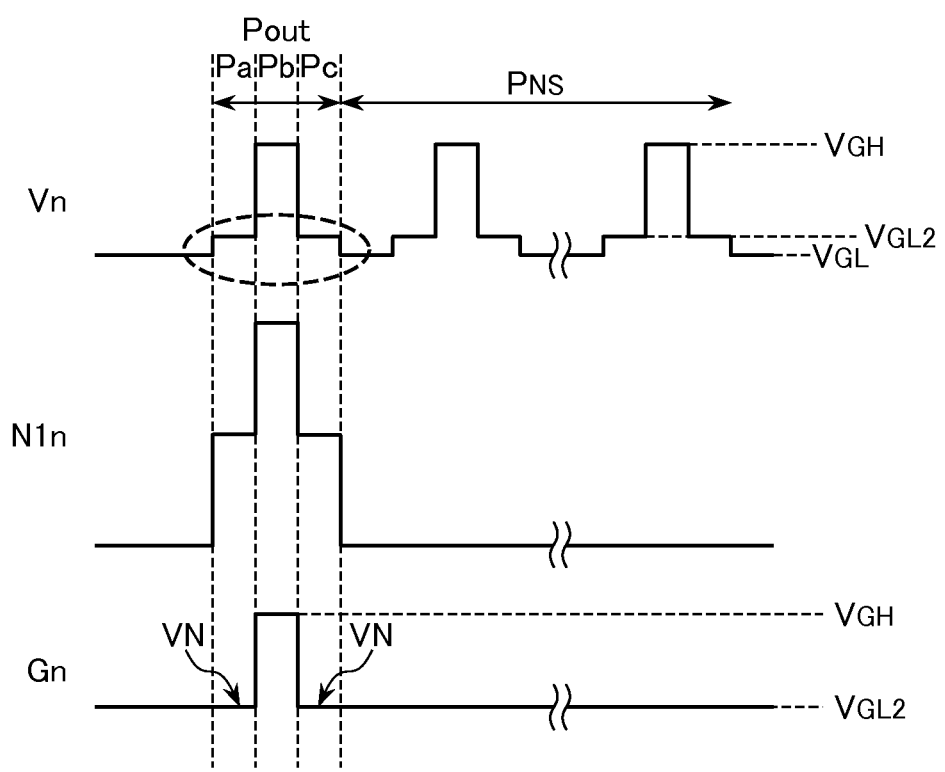
FIG. 15 is a diagram illustrating time changes of a basic clock signal, a node N1 of an n-th basic circuit, and a gate signal according to a sixth embodiment of the invention.

FIG. 15 is a diagram illustrating time changes of the basic clock signal $V_n$, the node N1 of the n-th basic circuit 113-$n$, and the gate signal $G_n$ according to this embodiment. The basic clock signal $V_n$ according to this embodiment is different in a clock waveform from the basic clock signal $V_n$ according to the first embodiment illustrated in FIG. 12. The basic clock signal $V_n$ according to this embodiment becomes the high voltage $V_{GH}$ in the first clock, becomes the second low voltage $V_{GL2}$ in the second clock and the third clock as surrounded by a dashed line in FIG. 15, and becomes the first low voltage $V_{GL}$ in (m−3) clocks other than the first, second, and third clocks. As described above, the transistor T5 is on in the periods Pa and Pc, and the transistor T5 outputs the second low voltage $V_{GL2}$ of the basic clock signal $V_n$ as the low voltage of the gate signal $G_n$ in the periods Pa and Pc. Hence, the voltage fluctuation generated in the periods Pa and Pc is suppressed, and the low voltage of the gate signal $G_n$ is held by the normal voltage $V_N$ (second low voltage $V_{GL2}$). The low voltage fluctuation generated in the periods Pa and Pc is suppressed to further reduce the power consumption. Further, the remarkable advantages are obtained in the quality improvement of the image displayed by the liquid crystal display described in the fourth and fifth embodiments.

The gate signal line drive circuit 104 may use the m-phase basic clock signal that becomes the high voltage $V_{GH}$ in the first clock, and becomes the second low voltage $V_{GL2}$ in (m−1) clocks other than the first clock. The same advantages as those in this embodiment are obtained, and the basic clock signal can be generated with the use of a binary power circuit having the second low voltage $V_{GL2}$ and the high voltage $V_{GH}$.

The embodiment of the invention has been described with the use of the four-phase basic clock signal, but the invention is not limited to this configuration. The gate signal line drive circuit uses the m-phase (integer of m≥3) basic clock signals. In the basic circuit where the first basic clock signal that becomes the high voltage $V_{GH}$ in the first clock in the m-phase basic clock signals is input to the input terminal of the transistor T5, when the transistor T5 is on in a period which is one previous clock of the signal high period, the second clock of the first basic clock signal is the second low voltage $V_{GL2}$ to suppress the low voltage fluctuation ΔVF1 of the output gate signal $G_n$. Likewise, when the transistor T5 is on in a period which is one next clock to the signal high period, the third clock of the first basic clock signal is the second low voltage $V_{GL2}$ to suppress the low voltage fluctuation ΔVF2 of the output gate signal $G_n$.

In the basic circuits 113 illustrated in FIGS. 4 and 10, two transistors are disposed in parallel to each other in each of the low voltage supply switching circuit 11 and the high voltage supply off control circuit 13. However, the number of transistors is not limited to two. Three, four or more transistors may be provided. In this case, the corresponding AC voltage lines are connected to the input terminals of the respective transistors. The time when the high voltage is supplied to the transistors is shared by the larger number of transistors, and the time when the high voltage is supplied to each transistor can be further reduced.

Also, in the shift register circuit 112 according to this embodiment, as illustrated in FIG. 3, a case in which the plurality of basic circuits 113 are arranged on both sides of the display area 120 has been described. However, for example, the invention can be supplied to a case in which the basic circuits 113 are arranged on one side of the display area 120, or other cases.

Figure 16:
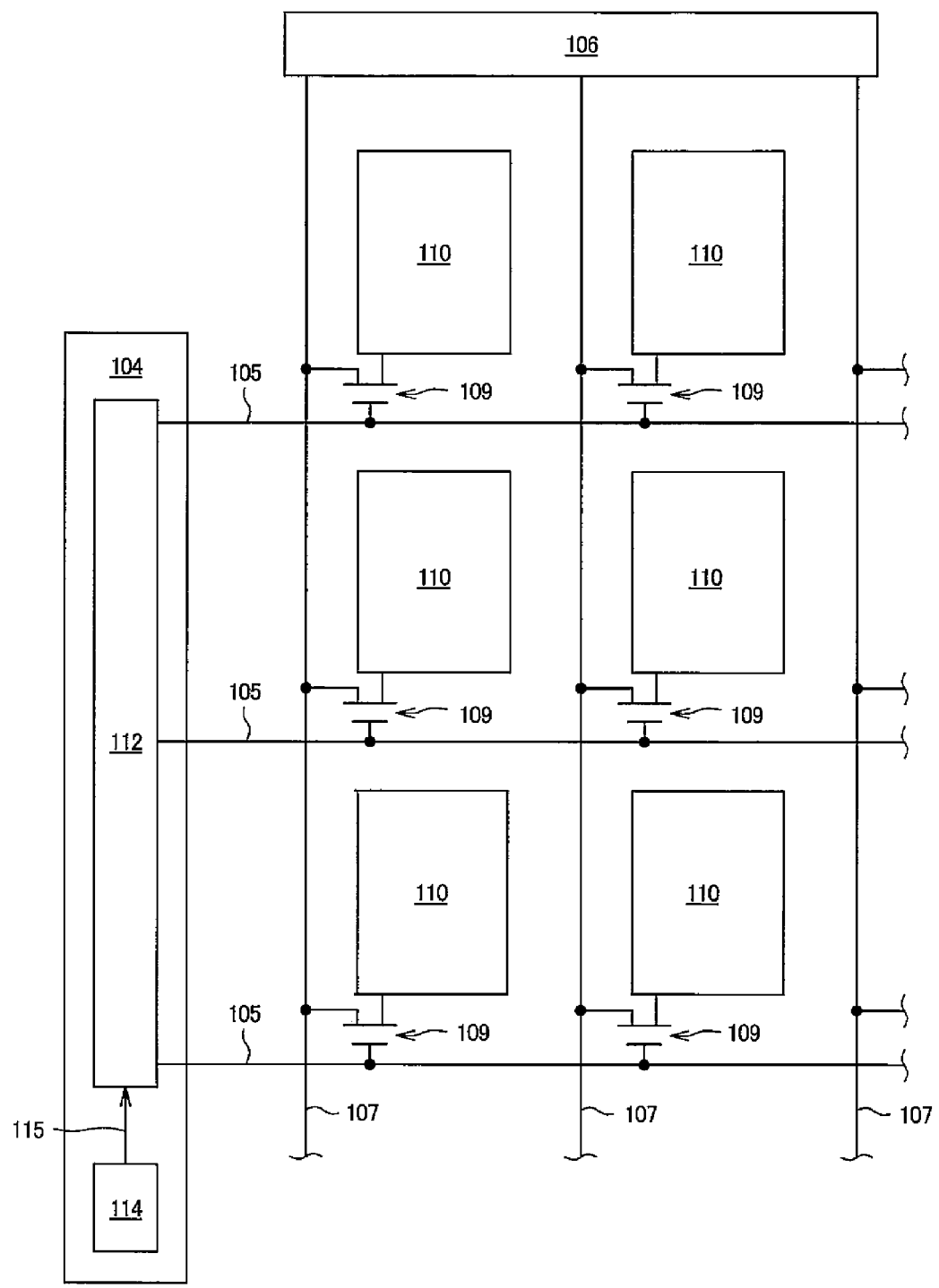
FIG. 16 is a conceptual view of an equivalent circuit of a TFT substrate provided in a liquid crystal display device according to another example of the embodiment of the invention.
Figure 17:
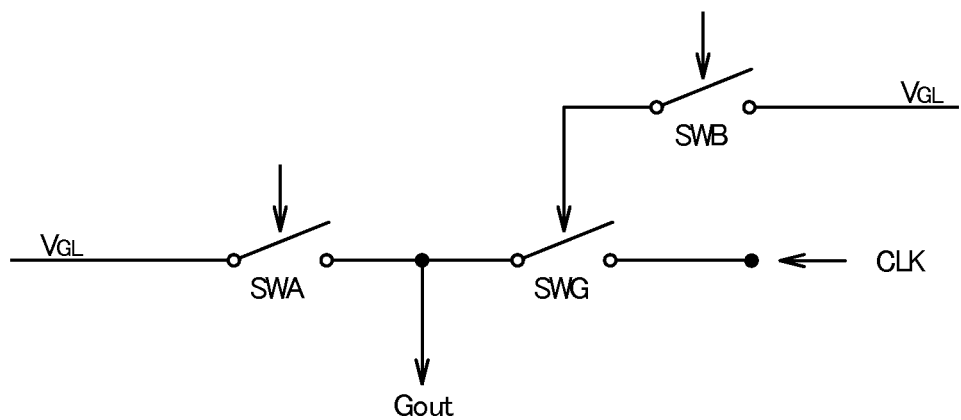
FIG. 17 is a schematic diagram illustrating a configuration of a shift register circuit in a related art.

Further, in the display according to this embodiment of the invention, as illustrated in FIG. 2, the IPS liquid crystal display device has been described. However, the display according to the invention may be liquid crystal display devices of other drive systems such as a VA (vertically aligned) liquid crystal display device or a TN (twisted nematic) liquid crystal display device, or may be other display devices such as an organic EL display device. FIG. 16 is a conceptual view of an equivalent circuit of the TFT substrate 102 provided in a liquid crystal display device according to another example of the embodiment of the invention. FIG. 16 illustrates an equivalent circuit of the TFT substrate 102 provided in the VA liquid crystal display device and the TN liquid crystal display device. In the VA liquid crystal display device and the TN liquid crystal display device, the common electrodes 111 are disposed on the filter substrate 101 that faces the TFT substrate 102.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A gate signal line drive circuit that supplies a high voltage to gate signal lines in a signal high period periodically repeated, and supplies a low voltage to the gate signal lines in a signal low period which is a period other than the signal high period, the gate signal line drive circuit comprising:
   a high voltage supply switching element that receives a first basic clock signal which becomes the high voltage in the signal high period at an input terminal thereof, turns on in response to the signal high period, supplies a voltage of the first basic clock signal to the gate signal lines, and turns off in response to the signal low period;
   a high voltage supply off control circuit that supplies a first low voltage to a switch of the high voltage supply switching element in response to the signal low period to turn off the high voltage supply switching element; and
   a low voltage supply switching circuit that supplies a second low voltage higher than the first low voltage to the gate signal lines as the low voltage in response to the signal low period, and turns off in response to the signal high period,
   wherein the high voltage supply off control circuit comprises:
      a first high voltage supply off control element having an input terminal connected with a first voltage line, and an output terminal connected to the switch of the high voltage supply switching element; and
      a second high voltage supply off control element having an input terminal connected with a second voltage line, and an output terminal connected to the switch of the high voltage supply switching element,
   wherein the low voltage supply switching circuit comprises:
      a first low voltage supply switching element having an input terminal connected with a third voltage line, and an output terminal connected with the gate signal lines; and
      a second low voltage supply switching element having an input terminal connected with a fourth voltage line, and an output terminal connected with the gate signal lines, and wherein in a first period including two or more signal high periods sequentially coming, and starting from the signal low period, the first low voltage is supplied to the first voltage line, and the second low voltage is supplied to the third voltage line, the first high voltage supply off control element and the first low voltage supply switching element are in a drive on-state to turn on/off, and the second high voltage supply off control element and the second low voltage supply switching element are in a drive off-state to be kept in an off-state.

2. The gate signal line drive circuit according to claim 1, further comprising a first control switching element that turns on in the first period, supplies the first low voltage to a switch of the second low voltage supply switching element, and puts the second low voltage supply switching element into the drive off-state.

3. The gate signal line drive circuit according to claim 1, wherein in a second period including two or more signal high periods sequentially coming, and starting from the signal low period, and subsequent to the first period, the first low voltage is supplied to the second voltage line, and the second low voltage is supplied to the fourth voltage line, the second high voltage supply off control element and the second low voltage supply switching element are in the drive on-state, and the first high voltage supply off control element and the first low voltage supply switching element are in the drive off-state.

4. The gate signal line drive circuit according to claim 3, further comprising a second control switching element that turns on in the second period, supplies the first low voltage to a switch of the first low voltage supply switching element, and puts the first low voltage supply switching element into the drive off-state.

5. The gate signal line drive circuit according to claim 1, wherein the high voltage is supplied to the second voltage line and the fourth voltage line in the first period.

6. The gate signal line drive circuit according to claim 1, wherein an intermediate voltage between the first low voltage and the high voltage is supplied to the second voltage line in the first period.

7. The gate signal line drive circuit according to claim 6, wherein the intermediate voltage is a ground voltage.

8. The gate signal line drive circuit according to claim 1, wherein the second voltage line is connected to the third voltage line, and the fourth voltage line is connected to the first voltage line.

9. The gate signal line drive circuit according to claim 1, wherein the first basic clock signal is a clock signal that repeats m clocks (integer of m≥3) as a cycle, and wherein a second clock which is one previous clock of a first clock being the high voltage is the second low voltage, and the high voltage supply switching element is on in a period which is a clock before the high voltage period.

10. The gate signal line drive circuit according to claim 1, wherein the first basic clock signal is a clock signal that repeats m clocks (integer of m≥3) as a cycle, and wherein a third clock which is one next clock to a first clock being the high voltage is the second low voltage, and the high voltage supply switching element is on in a period which is a clock after the high voltage period.

11. A display comprising the gate signal line drive circuit according to claim 1.

* * * * *